(12) United States Patent
Wegener

(10) Patent No.: US 7,477,999 B2
(45) Date of Patent: Jan. 13, 2009

(54) DATA COMPRESSION FOR A WAVEFORM DATA ANALYZER

(75) Inventor: Albert W. Wegener, Portola Valley, CA (US)

(73) Assignee: Samplify Systems, Inc., Santa Clara, CA (US)

( * ) Notice: Subject to any disclaimer, the term of this patent is extended or adjusted under 35 U.S.C. 154(b) by 0 days.

(21) Appl. No.: 11/553,147

(22) Filed: Oct. 26, 2006

(65) Prior Publication Data

US 2008/0103710 A1    May 1, 2008

(51) Int. Cl.
*G06F 19/00* (2006.01)
(52) U.S. Cl. ...................................... 702/66
(58) Field of Classification Search ............... 702/66
See application file for complete search history.

(56) References Cited

U.S. PATENT DOCUMENTS

| | | | |
|---|---|---|---|
| 5,790,133 | A | 8/1998 | Holcomb et al. |
| 5,899,970 | A | 5/1999 | Sonohara |
| 6,112,160 | A | 8/2000 | Salant et al. |
| 6,222,521 | B1 | 4/2001 | Ivers et al. |
| 6,473,700 | B1 | 10/2002 | Holaday et al. |
| 6,748,335 | B2 | 6/2004 | Pickerd |
| 6,850,237 | B2 | 2/2005 | Nakayama |
| 6,937,979 | B2 | 8/2005 | Gao et al. |
| 6,989,833 | B2 | 1/2006 | Narita |
| 7,031,882 | B2 | 4/2006 | Endo et al. |
| 2003/0163774 | A1 | 8/2003 | Parrish |
| 2005/0021275 | A1 | 1/2005 | Lawrence et al. |
| 2005/0268177 | A1 | 12/2005 | John |
| 2006/0075212 | A1 | 4/2006 | Cheng et al. |
| 2006/0143518 | A1 | 6/2006 | Cheng et al. |

OTHER PUBLICATIONS

Kaj Rosengren, Modelling and implementation of an MPEG-2 video decoder using a GALS design path, Jun. 21, 2006, p. 1-78.*
P.N. Tudor, MPEG-2 Video Compression, IEE J Langham Thompson Prize, Electronic & Communication Engineering Journal, Dec. 1995, section 1-7.*
A. Mendelsohn, "<b><I>Focus On</b></I>: <b>New oscilloscopes pace designer's technologies</b>" URL: http://www.eeproductcenter.com/showArticle.jhtml?articleID=20300680, May 12, 2004, 15 pp.

(Continued)

*Primary Examiner*—Tung S Lau
(74) *Attorney, Agent, or Firm*—Carolyn Koenig; Haynes Beffel & Wolfeld LLP

(57) ABSTRACT

A compressor for waveforms having at least two waveform states separates the waveform samples into waveform state sample vectors for each waveform state. Waveform state encoders encode the waveform state sample vectors separately to provide compressed waveform data. The waveform state encoder selects waveform state pattern vector and associated codes to represent the waveform state sample vectors. The differences between samples of the waveform state sample vector and waveform state pattern vector are calculated and encoded. Encoding can be lossless or lossy. The waveform state pattern vectors and other parameters for compression are determined during a training period. The waveform state encoders detect features in the waveform state sample vectors and waveform state pattern vectors that are useful for common oscilloscope measurements. Typical waveform states include level states and edge states.

21 Claims, 24 Drawing Sheets

OTHER PUBLICATIONS

Tektronix application note, "Analyzing Clock Jitter Using Mathcad," www.tektronix.com/accessories, Jan. 2001, HMH/PG, 55W-14548-0, 10 pp., 2001.

L. Pillai, "Variable Length Coding," Application Note: Virtex-II Series, XILINX, XAPP621 (v.1.1) Jan. 31, 2005, 5 pp.

L. Pillai, "Huffman Coding," Application Note: Virtex Series, XILINX, XAPP616 (v.1.0) April 22, 2003, 16 pp.

Agilent Technologies application note 1568, "Making the Most of Your Infiniium 80000 Series Scope's Acquisition Memory," Nov. 15, 2005, 5989-4198EN, 15 pp.

G. Foster, "Stressed Eye Primer," SyntheSys Research, Inc., Sep. 2005, ver 1.1, SR-TN038, 17 pp.

G. Foster, "Dual-Dirac, Scope Histograms and BERTScan Measurements—A Primer," SyntheSys Research, Inc., Sep. 2005, SR-TN045, 20 pp.

G. Foster, "Measurement Brief: Examining Sampling Scope Jitter Histograms," SyntheSys Research, Inc., Jul. 2005, SR-TN043, 5 pp.

J.R. Andrews, "Comparison of Ultra-Fast Rise Sampling Oscilloscopes," Picosecond Pulse Labs application Note AN-2a, Feb. 1989, 8 pp.

"IEEE Standard on Transitions, Pulses, and Related Waveforms," IEEE Std 181-2003 (Rev. of IEEE Std 181-1977 and IEEE Std 194-1977), approved Mar. 20, 2003, 8 pp.

Tudor, P.N., "MPEG-2 Video Compression," Electronics & Communication Engineering Journal, Dec. 1995, 17 pages.

International Search Report Mailed Apr. 25, 2008 in Application No. PCT/US07/81967 filed on Oct. 19, 2007, 21 pages.

* cited by examiner

| Sample Value: | 119 | 120 | 120 | 121 | 118 | 120 | 121 | 119 | 121 | 122 — 734 |
|---|---|---|---|---|---|---|---|---|---|---|
| Huffman Token: | 011 | 11 | 11 | 10 | 0101 | 11 | 10 | 011 | 10 | 001 — 736 |

Figure 11

| | | | | | | | | | | |
|---|---|---|---|---|---|---|---|---|---|---|
| Run Length (in samples): | 10 | 21 | 20 | 11 | 31 | 19 | 49 | 9 | 11 | 21 — 738 |
| No. of Bauds: | 1 | 2 | 2 | 1 | 3 | 2 | 5 | 1 | 1 | 2 — 740 |
| Leftover (samples): | 0 | 1 | 0 | 1 | 1 | -1 | -1 | -1 | 1 | 1 — 742 |
| | | | | | | | | | | |
| No. Bauds Token: | 0 | 0 | 10 | 0 | 110 | 10 | 11110 | 0 | 0 | 10 — 744 |
| Leftover Token: | 0 | 10 | 0 | 10 | 10 | 11 | 11 | 11 | 10 | 10 — 746 |

Figure 12

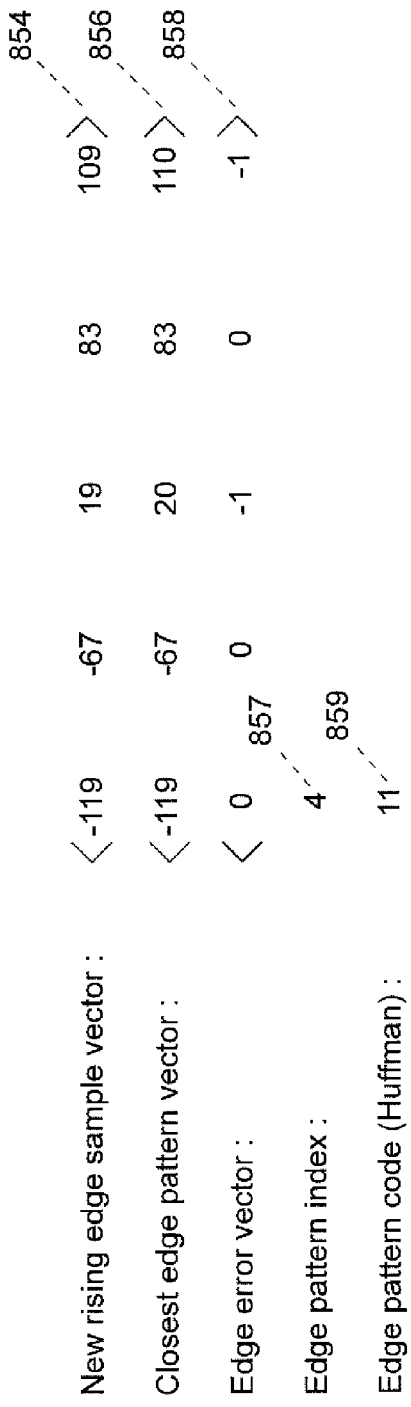

Table A

| Exponent | Range of Error | Error | Mantissas Tokens |
|---|---|---|---|
| 0 | no error | --- | --- |
| 101 | 0 or +1 | 0, +1 | 0, 1 |
| 110 | 0 or -1 | 0, -1 | 0, 1 |
| 1001 | -1 to +1 | -1, 0, +1 | 11, 0, 10 |
| 1110 | -2 to +2 | -2, -1, 0, +1, +2 | 1111, 110, 0, 10, 1110 |

$\overbrace{\phantom{XXXXXXXXXXXXXXXXXXXXXXXXXXXXXXXXXXXXX}}$
A1    A2    A3    A4

860

Encoded Edge :   100,  110, (0, 0, 1, 0, 1)
                   860a  860b    860c Interpreted As :  100 :  edge pattern index 4
                   110 :  range of error 0 or -1
                   0, 0, 1, 0, 1 :  encoded edge error samples
                               for edge error samples 0, 0, -1, 0, -1

Figure 19

DATA COMPRESSION FOR A WAVEFORM DATA ANALYZER

BACKGROUND OF THE INVENTION

The present invention relates to a waveform data analyzer, such as a digital storage oscilloscope or logic data analyzer, and particularly relates to compressing samples and extracting features of a waveform that has a plurality of waveform states.

Waveform data analyzers acquire, process, store and display large amounts of waveform data for analysis and display over extended periods of time. To accommodate requirements for digitizing and analyzing waveforms with greater bandwidths, sample rates of analog-to-digital converters in waveform data analysis systems have increased to tens of gigasamples per second. The large amount of data requiring storage and transfer for display can result in undesirable delays and loss of data. Compression of the waveform samples enables efficient use of resources in the waveform data analysis system, including the memory for storing waveform data and the high-speed data interfaces for transferring waveform data for display. Compression is vital for supporting increasing data bandwidths in waveform data analysis systems.

In the commonly owned U.S. Pat. No. 7,071,852 B1 ("the '852 patent") entitled "Enhanced Test and Measurement Instruments Using Compression and Decompression," dated Jul. 4, 2006 and incorporated herein by reference, the present inventor describes compression and decompression of bandlimited signals. Compression and decompression in a digital storage oscilloscope (DSO) are described in the '852 patent with respect to FIGS. 38 and 39. The algorithms disclosed apply to compressing/decompressing bandlimited signals and measuring signal parameters such as the center frequency. In the commonly owned and copending U.S. patent application, application Ser. No. 11/458,771 (the '771 application) entitled, "Enhanced Time-Interleaved A/D Conversion Using Compression," filed on Jul. 20, 2006, the present inventor describes compression of a bandlimited signal that is sampled by a parallel time-interleaved analog-to-digital converter (TIADC). The compression methods described therein are designed to take advantage of the parallel architecture of the TIADC. The compression methods of the '771 application can be implemented in a waveform analysis system, such as a DSO, that includes a TIADC. The present invention is directed to compression and decompression of a signal waveform with recurring waveform states and teaches specialized algorithms for this particular type of waveform.

In general, current digital oscilloscopes use a type of data compression that is actually data reduction for rapid display of reduced data. The data compression methods select only certain samples to represent all the waveform samples in a particular time interval. Selection methods described by Holcomb et al. in U.S. Pat. No. 5,790,133 include peak detection, where only the minimum and maximum samples for every N number of samples are selected, and glitch detection, where only the glitch samples for every N number of samples are selected. This type of data compression is actually data reduction, where most samples are simply discarded. The resulting reduced data include only a small fraction of the original samples. Furthermore, this type of compression by reduction is irreversible. Other waveform samples of the N samples cannot be reconstructed from the selected samples. Architectures for these digital oscilloscopes include a deep memory for storing the original waveform samples, allowing zoom-in display functions. The deep memory is continuously rewritten by newly acquired waveform samples.

Digital oscilloscope architectures also include processors that detect properties of the waveform samples. In U.S. Pat. No. 6,989,833 B2, Narita describes processing pulsed waveforms for measurements of pulse width, period, duty cycle, rise time and fall time.

A logic data analyzer architecture that includes data compression is described by Endo et al. in U.S. Pat. No. 7,031,882 B2. For this architecture, probes acquire digital signals that are input to a logic analyzer device where they are compressed by run-length encoding prior to transfer over a high speed interface to a computer. The computer can decompress the compressed data for display or further compress the data for storage.

In US Patent Application 2006/0143518 A1, Cheng et al. describe a logic analyzer device that compresses test data for storage on the device. The compressed data is decompressed before transmission over an interface to a computer where it is displayed. In US Patent Application 2006/0075212A1, Cheng et al. describe a logic analyzer that compresses test data for storage in a memory or a buffer and decompresses the compressed data for display. Neither of these applications describe a compression method.

It is often the case that the waveform being analyzed has two or more waveform states. The waveform states can represent recurring characteristics or redundancies in the waveform. The present invention exploits redundancies in the waveform shape to achieve more efficient compression than is available from conventional methods. Furthermore, the present invention's compression algorithms are computationally efficient so that compression can be performed in real time, or as at least fast as the sample rate of the waveform samples, rather than by post-processing of the waveform samples already stored in an acquisition memory.

The efficiency and speed of compression in the present invention increase the capacities of the resources of the waveform data analysis system, including memory and data transfer interfaces. The waveform data analysis system can store more waveform data and transfer data at a higher speed for further analysis or display to a user.

SUMMARY OF THE INVENTION

The present invention exploits redundancies in the waveform being analyzed to achieve greater compression. Waveform states are defined that represent the repeating characteristics of the waveform. The waveform samples in a given waveform state are similar to each other, although recurrences of the same waveform state may be separated in time. An encoder is customized for each waveform state. The customized encoder is applied to all the waveform samples in that state, whenever that state is encountered. Applying the same encoder to all samples in the same waveform state achieves greater compression than is available from the conventional approach of using the same encoder for all samples in the waveform.

An object of the invention is to provide a method and a system for compressing waveform samples in a waveform data analyzer by decomposing the waveform samples into characteristic waveform states to form waveform state sample vectors. Each waveform state sample vector is then compressed by a waveform state encoder particular for the waveform state. The waveform states can include a level state corresponding to level portions of the waveform samples and an edge state corresponding to edge portions between level portions that have different amplitudes. The level state sample vectors are encoded by a corresponding level state encoder and the edge state sample vectors are encoded by a corresponding edge state encoder. Also, an object of the invention is to provide computationally efficient compression and decompression so that waveform samples are compressed or decompressed in real time, or at least as fast as the sample rate of the waveform samples.

Another object of the invention is to train each waveform state encoder by forming a set of waveform state pattern vectors for each waveform state. The waveform state pattern vectors are used by the waveform state encoder to compress the corresponding waveform state sample vectors.

Another object of the invention is to extract features of the waveform from the waveform state sample vectors or the waveform state pattern vectors. The features provide useful measurements of the waveform for further processing or display.

Another object of the invention is to decompress the compressed waveform data by reconstructing the waveform state sample vectors for the various portions of the waveform. The reconstructed waveform samples can then be processed for display.

An advantage of greater compression enabled by the present invention is that the memory in a waveform data analysis system can store more waveform samples, or alternatively, the memory size needed to store a given number of samples can be reduced. Another advantage is to enable faster data transfer across a high speed interface. This reduces delays in transferring data for display to a user, thus meeting the user's need for prompt analysis.

Another advantage of the present invention is that waveform features commonly used to by those skilled in the art of test and measurement can be calculated efficiently as part of the compression process, providing the user with timely information about the waveform. The time-varying statistics of the waveform features can also be calculated and presented to the user in addition to or instead of the waveform features themselves, according to the user's preference.

BRIEF DESCRIPTION OF THE DRAWINGS

FIG. 11 gives an example of waveform sample amplitudes and corresponding Huffman codes in accordance with a preferred embodiment.

FIG. 12 gives an example of encoding run length in accordance with a preferred embodiment.

FIGS. 18a and 18b give an example of edge encoding in accordance with a preferred embodiment.

FIG. 19 gives an example of edge error encoding in accordance with a preferred embodiment.

DETAILED DESCRIPTION

Figure 1A:
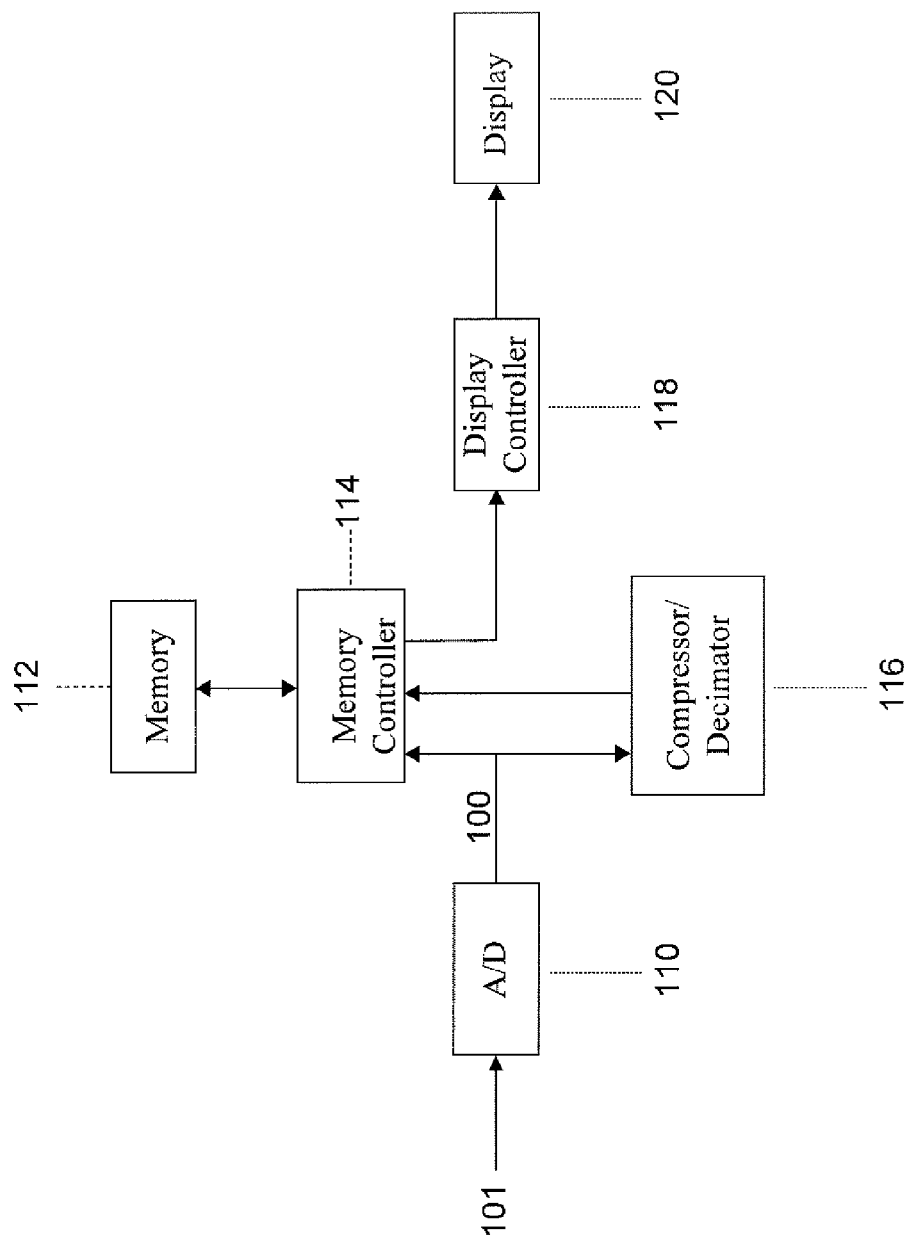
FIG. 1 is a block diagram of a digital storage oscilloscope (DSO) according to the prior art.
Figure 1B:
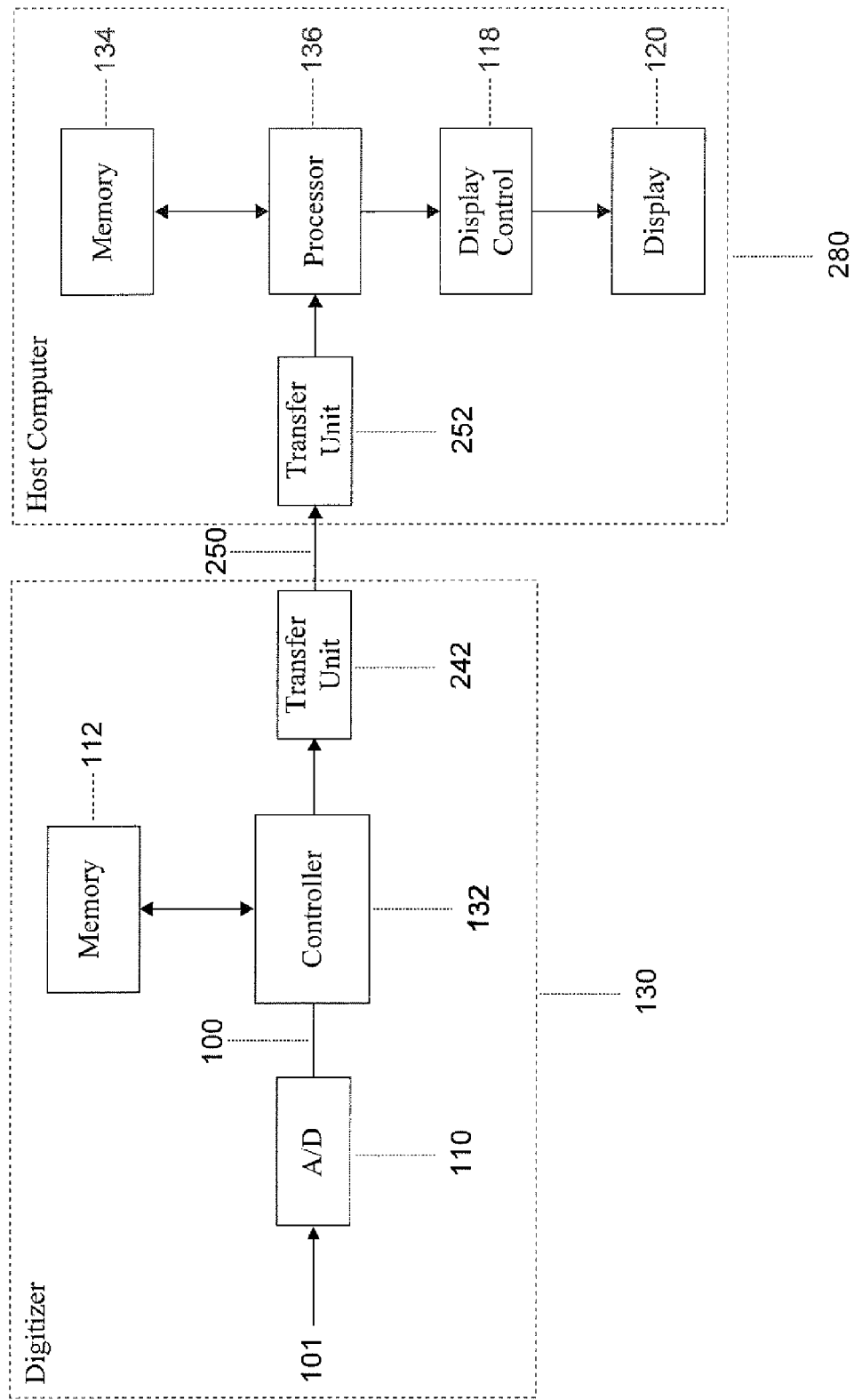

FIGS. 1a and 1b give examples of architectures of waveform data analyzers according to the prior art. FIG. 1a is a block diagram of an example of a simplified architecture for a digital storage oscilloscope (DSO). This architecture includes an analog-to-digital converter 110 for sampling an analog waveform 101 to form waveform samples 100. Compressor/decimator 116 selects a subset of samples for storage and display. The compressor/decimator 116 can decimate, or select every $n^{th}$ sample, to form the subset. Alternatively, compressor/decimator 116 can select the minimum and maximum samples for every N waveform samples or apply other selection criteria. The samples selected for the subset form reduced data. The reduced data and the original waveform samples 100 are stored in memory 112 under the control of memory controller 114. For displaying data spanning a long time interval, the reduced data are retrieved from memory 112 and processed by display controller 118 for display 120. The reduced data are not decompressed prior to displaying because the data reduction or decimation process is irreversible. For zooming in and displaying data with higher resolution over a short time interval, the original waveform samples can be retrieved from memory 112 for display 120. Many variations in architectures for digital storage oscilloscopes, including different memory configurations and access strategies, are known to those skilled in the art.

FIG. 1b is a block diagram of an example of a waveform data analysis system according to the prior art. In this system, a digitizer device 130 captures waveform samples 100 and transfers them over an interface 250 to a host computer 280. The digitizer device 130 typically includes an analog-to-digital converter 110 for sampling an analog waveform 101 to form waveform samples 100. The waveform samples 100 are stored in memory 112 until retrieved by controller 132 for transfer unit 242. In the host computer 280, transfer unit 252 receives the waveform samples from interface 250. The waveform samples can then be processed, stored and displayed using the resources of the host computer 280.

Figure 2A:
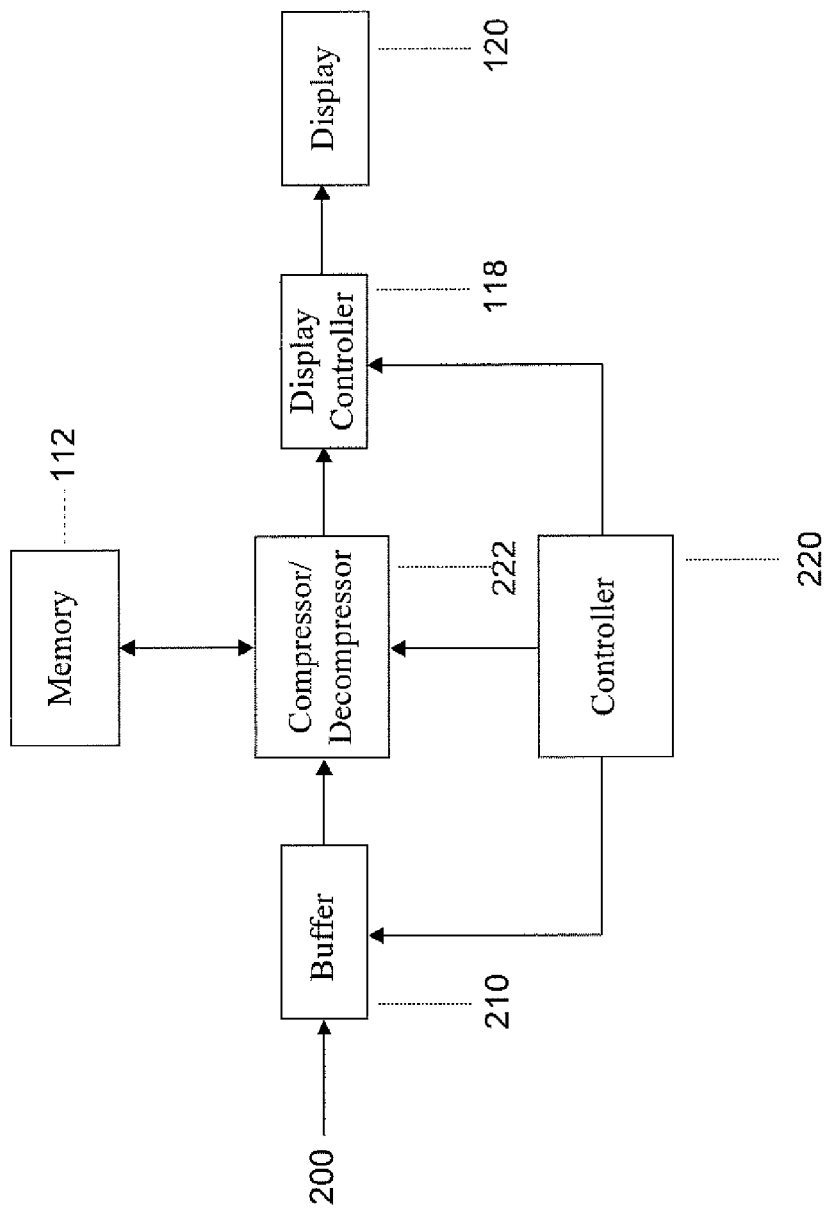
FIG. 2a is a block diagram of a logic data analyzer according to the prior art.

FIG. 2a is a block diagram of an example of a logic data analyzer according to the prior art. Digital signals 200 are input to buffer 210 prior to compression by compressor/decompressor 222. Compressor/decompressor 222 compresses the digital signals 200 to form compressed data prior to storing them in memory 112. Compressor/decompressor 222 also decompresses the compressed data for processing by display controller 118 for display 120. Unlike the digital storage oscilloscope example of FIG. 1, the compression is reversible, so that compressed data can be decompressed prior to displaying.

Figure 2B:
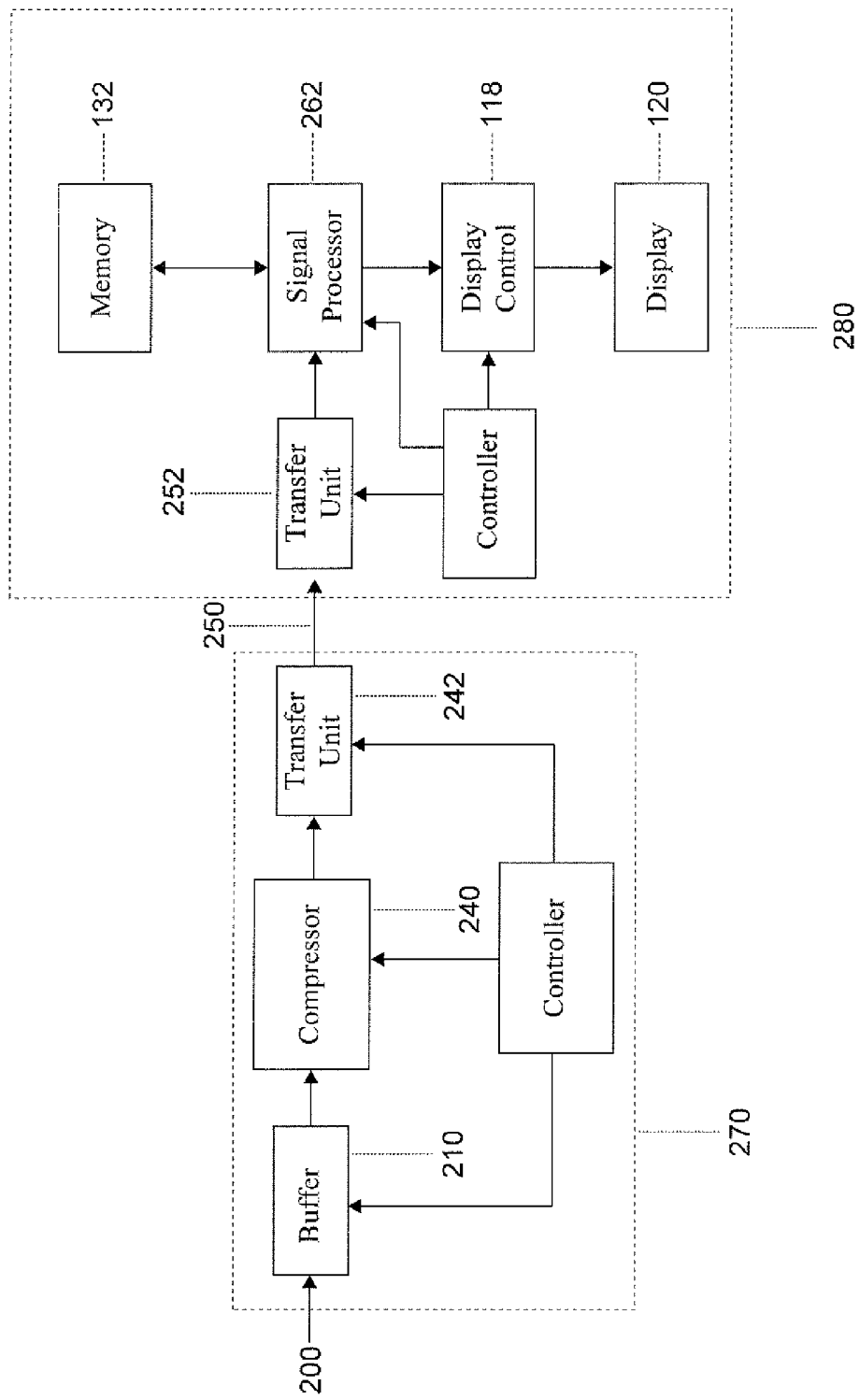
FIG. 2b is a block diagram of another logic data analyzer according to the prior art.

FIG. 2b is a block diagram of a logic data analyzer system that uses a host computer according to the prior art. In this architecture, digital signals 200 are acquired by a data acquisition device 270 where they are compressed and transferred over a high speed interface 250 to a host computer 280. In the data acquisition device 270, digital signals 200 are compressed by compressor 240 which applies reversible compression to form compressed data. Transfer unit 242 transfers the compressed data over high speed interface 250. In the host computer 280, transfer unit 252 receives the compressed data from the high speed interface 250. Signal processor 262 can decompress the data for displaying, further analyze the decompressed data, or store the compressed data in memory 132.

The present invention compresses waveform samples in a waveform data analyzer for efficient storage and data transfer. The compressed waveform data can be decompressed to reconstruct the waveform samples for display or further analysis. The compression and decompression methods are applicable to waveform samples with repeated characteristics. The waveform data analysis systems of FIGS. 1a and 1b can be adapted to implement the present invention. Referring to FIG. 1b, controller 132 can be adapted to implement compression of waveform samples 100. The compressed waveform data can be stored in memory 112, thereby increasing its capacity, and transferred over interface 250 to the host computer 280. In the host computer 280, the compressed waveform data can be stored in memory 134. Processor 136 can be adapted to implement decompression so that decompressed waveform samples can be displayed or analyzed. The logic data analyzers of FIGS. 2a and 2b can also be adapted to implement the present invention provided that digital signals 200 have repeated characteristics. Referring to FIG. 2a, compression and decompression of the present invention can be implemented in the compressor/decompressor 222. In the logic data analyzer system of FIG. 2b, the compressor 240 can be adapted to implement the compression method of the present invention and signal processor 262 can be adapted to implement the decompression method of the present invention.

Figure 3:
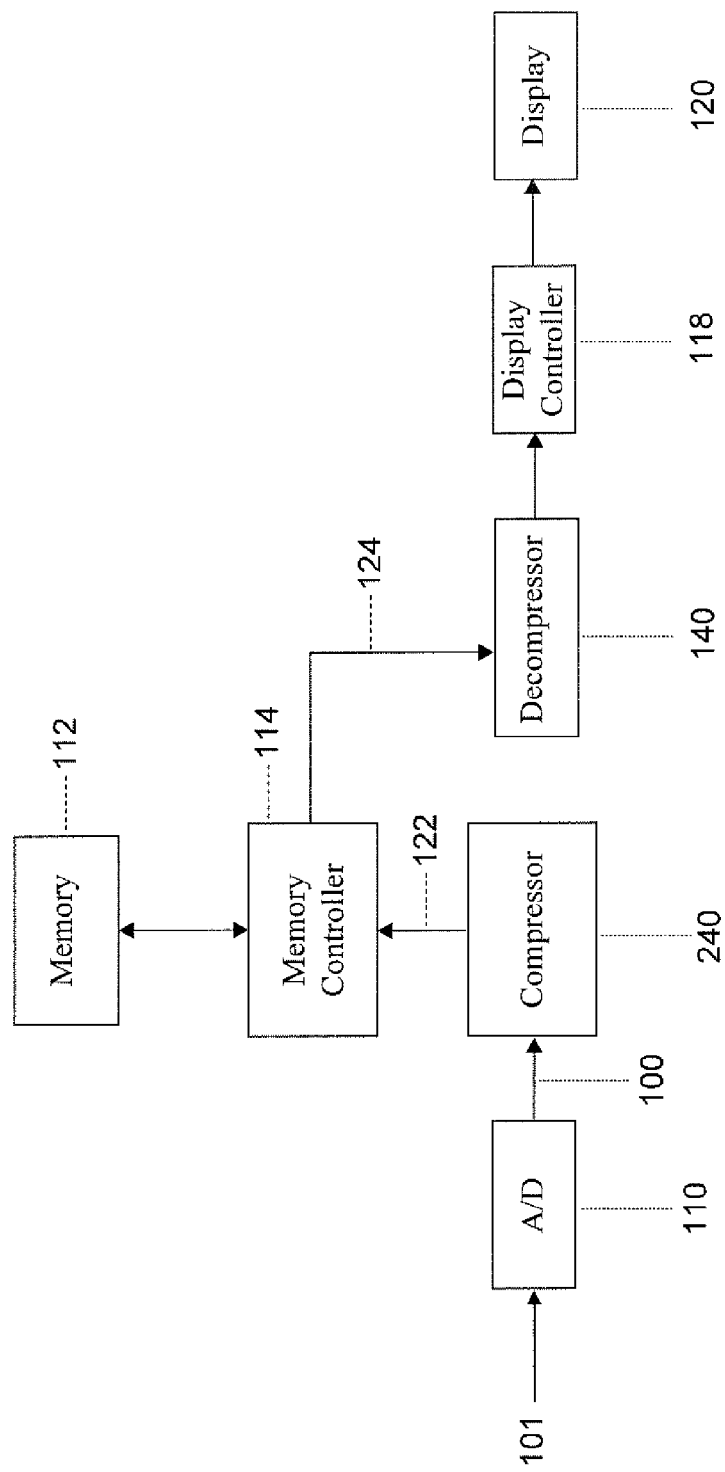
FIG. 3 is a block diagram of a digital storage oscilloscope for implementing compression and decompression in a preferred embodiment.

FIG. 3 is a block diagram of an example of a digital storage oscilloscope that can implement the compression and decompression of the present invention. This architecture is modified from that shown in FIG. 1a to include the compressor 240 and decompressor 140. In this architecture, compressor 240 compresses the waveform samples 100 in accordance with the present invention. The compressed waveform data can be stored in memory 112. Decompressor 140 reconstructs the waveform samples from the compressed waveform data for display 120. The waveform samples can be processed by compressor 240 or decompressor 140 to extract features of the sampled waveform for storage in memory 112, analysis or display. The present invention compresses the waveform samples 100 in real time as the samples are acquired. Variations of this architecture for a digital storage oscilloscope are readily apparent to those skilled in the art. For instance, connections 122 and 124 can be high-speed interfaces.

Figure 4:
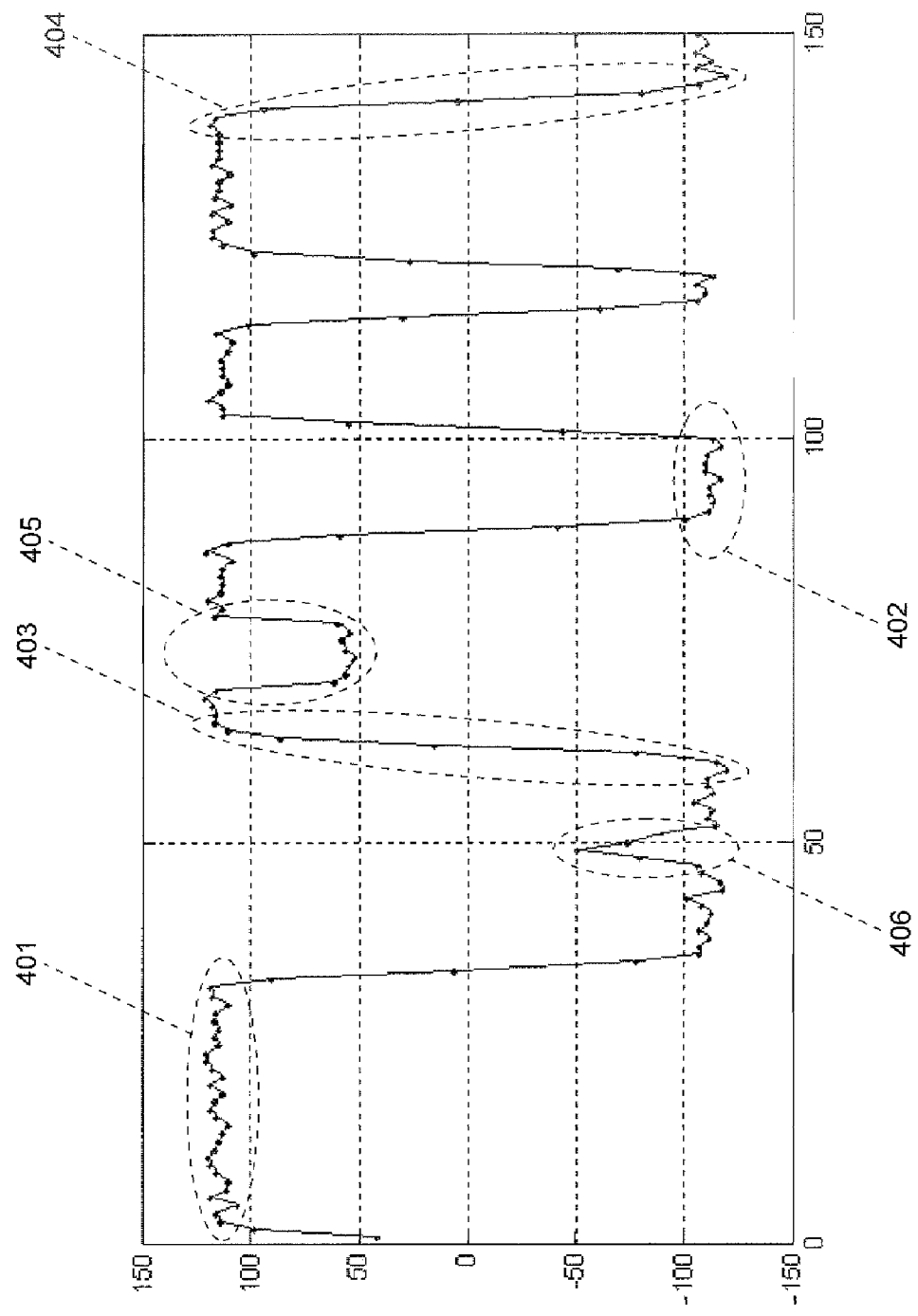
FIG. 4 is an example of a waveform with level portions, edge portions and glitches.

FIG. 4 is an example of a waveform to which compression of the present invention applies. The waveform has recurring characteristics, including level portions and edge portions. In addition to the level portions and edge portions, the waveform has "glitches" that include waveform samples that are discontinuous with the pattern of neighboring samples. This type of waveform is typical of a baseband signal that has two amplitude levels and is commonly captured by oscilloscopes and logic analyzers. Logic analyzers capture and store one bit per level (a "0" bit typically representing a low level and an "1" bit typically representing a high level). Oscilloscopes typically use 8 or more bits to sample each level, providing numerical values between −128 and +127 for 8-bit samples. The characteristics of the waveform in FIG. 4 include a high level portion 401 having a high level amplitude, a low level portion 402 having a low level amplitude, a rising edge 403, a falling edge 404, a positive glitch 406 that deviates in the positive direction, and a negative glitch 405 that deviates in the negative direction.

Figure 5:
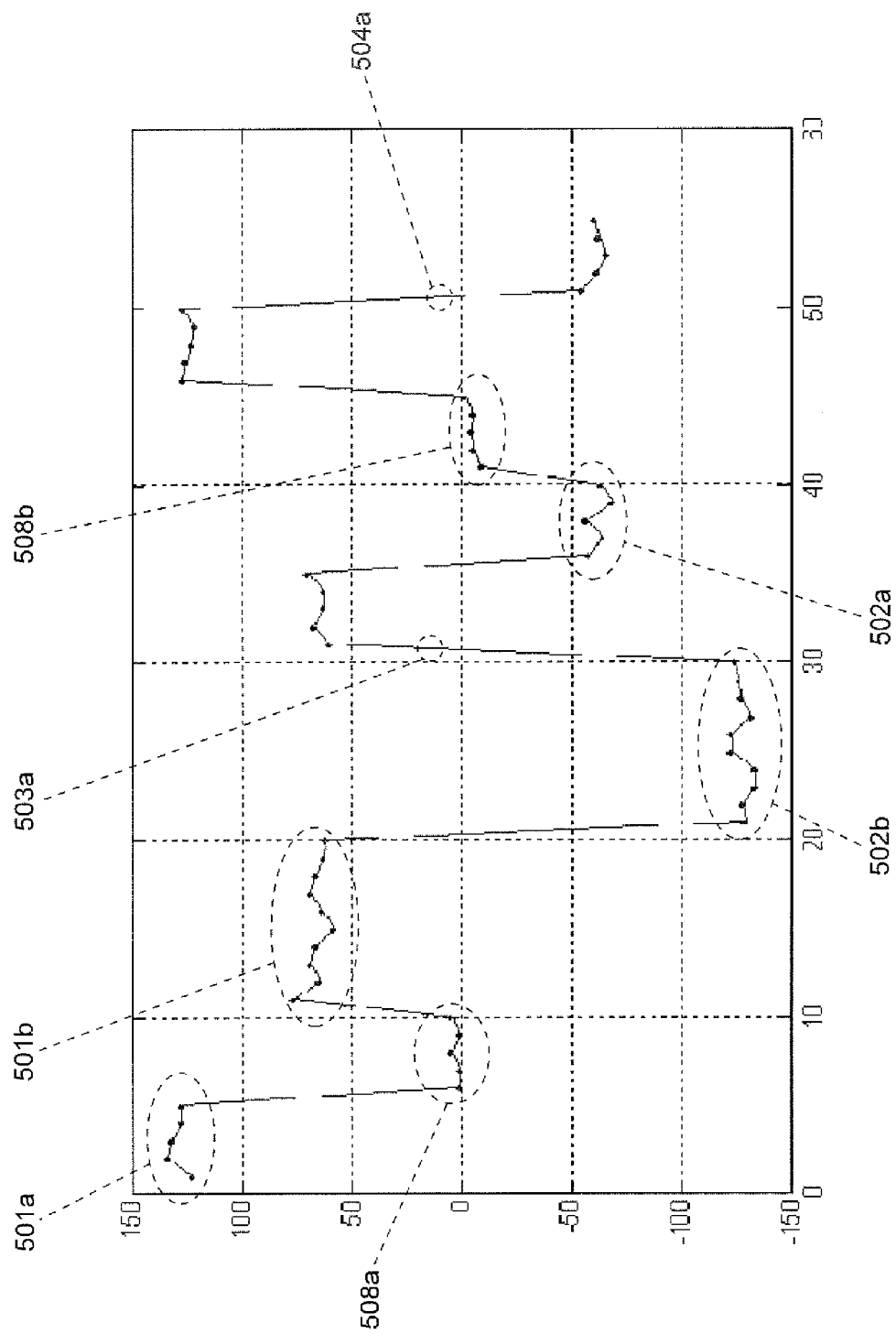
FIG. 5 is an example of a waveform with level portions having multiple level amplitudes.

FIG. 5 is an example of another waveform to which compression of the present invention applies. This waveform is typical of baseband signals that have five level amplitudes. The high level portions 501a and 501b have positive but differing level amplitudes. The low level portions 502a and 502b have negative but differing level amplitudes. The level portions 508a and 508b have a level amplitude of approximately zero. The waveform sampling in this example results in no samples in edge portions 503a and 504a.

Figure 6:
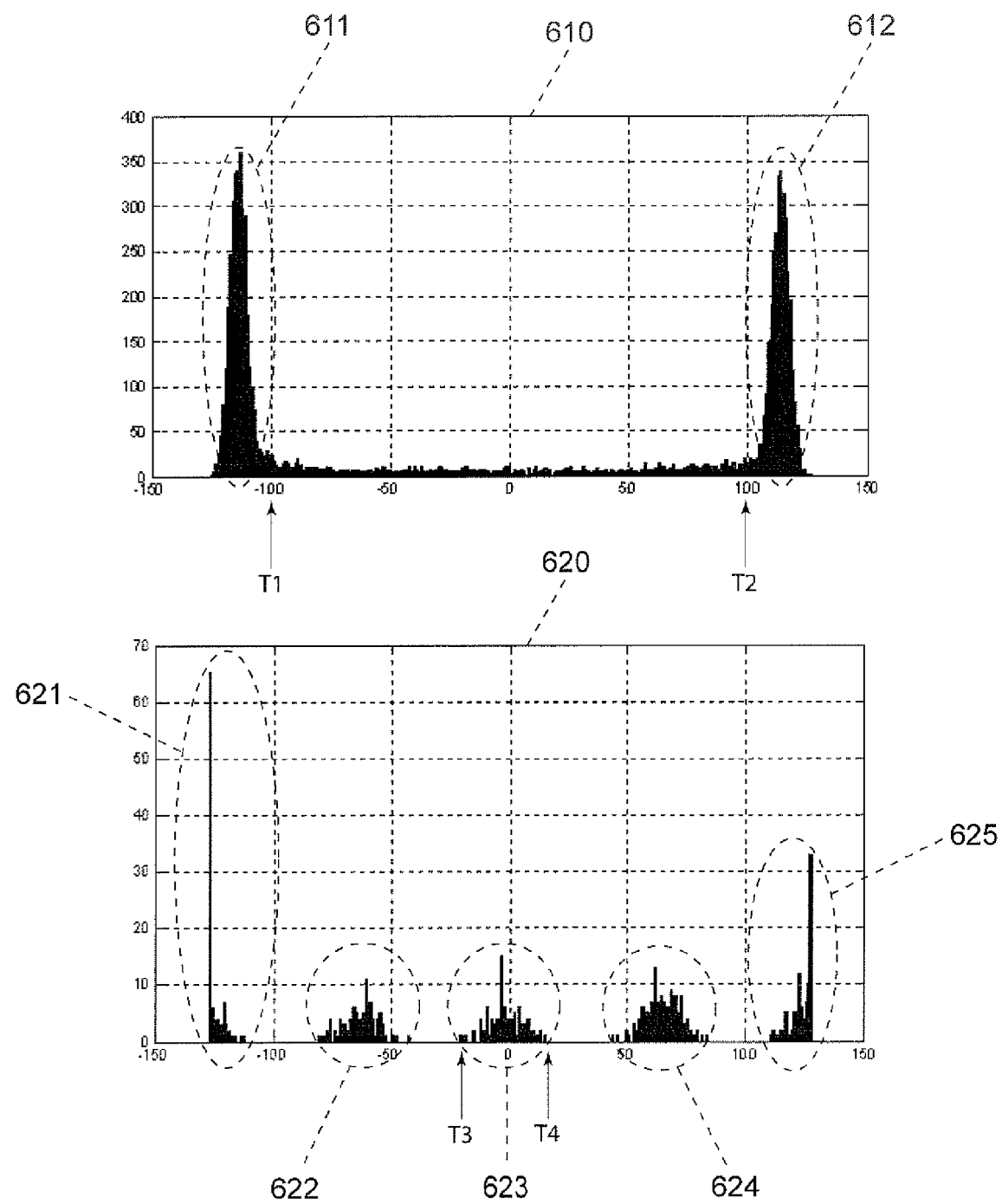
FIG. 6 gives histogram plots of the amplitudes of the waveform samples in FIGS. 4 and 5.

FIG. 6 gives histogram plots of the amplitudes of waveform samples in FIGS. 4 and 5. Histogram 610 plots the frequencies of the waveform sample amplitudes for the two-level waveform of FIG. 4. Histogram 610 shows that the amplitudes of the waveform samples fall into clusters 611 and 612 centered around two level states. Histogram 620 plots the frequencies of the waveform sample amplitudes for the five level waveform of FIG. 5. Histogram 620 shows that the amplitudes of the waveform samples fall into five clusters 621, 622, 623, 624 and 625 around the five level states. Because the amplitudes of most of the samples cluster around specific level states, specifying an encoder for each level state will provide more efficient compression than applying the same encoder to all samples.

Figure 7:
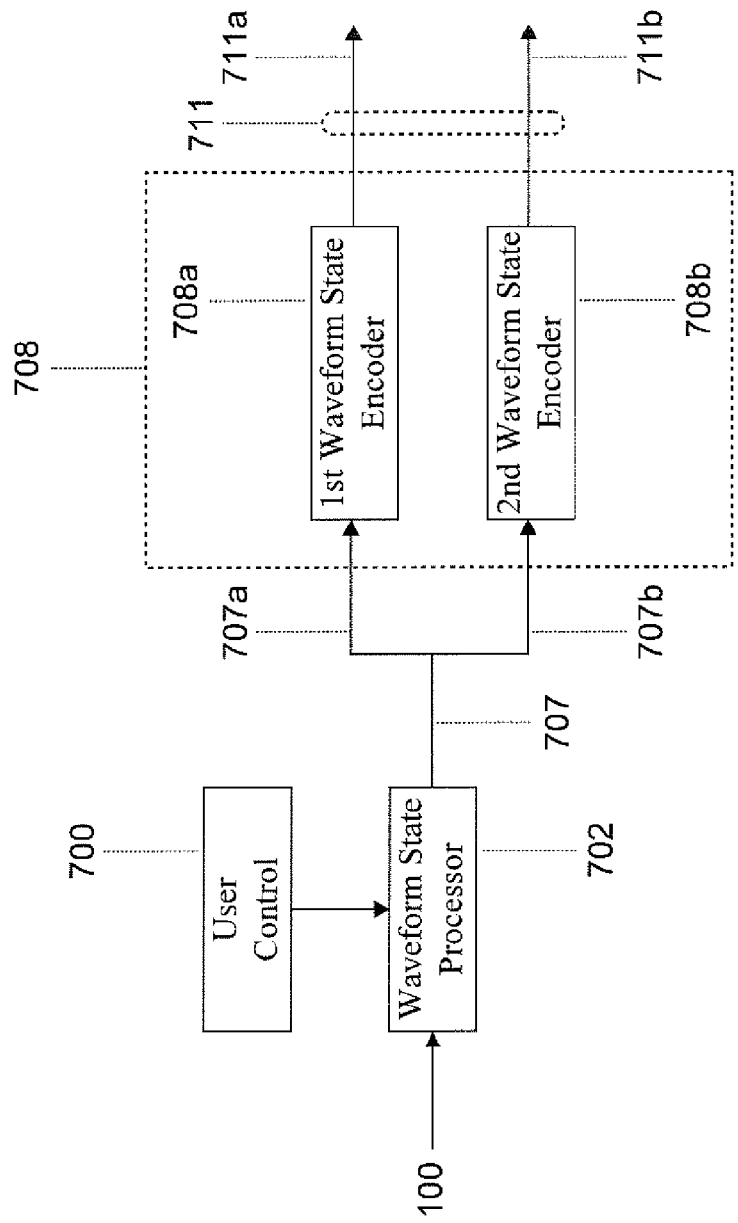
FIG. 7 is a top level block diagram of a compression system in accordance with a preferred embodiment.

FIG. 7 is a block diagram of a preferred embodiment of the present invention for waveform samples with at least two waveform states. Waveform state processor 702 determines the waveform states of the waveform samples 100 and produces waveform state sample vectors for encoder input 707. Each waveform state sample vector includes consecutive waveform samples in a particular waveform state. Encoder 708 includes a waveform state encoder for each waveform state. The waveform state sample vectors are directed to the corresponding waveform state encoder. For this example, waveform state sample vectors corresponding to the first waveform state are input 707a to the first waveform state encoder 708a and waveform state sample vectors corresponding to the second waveform state are input 707b to waveform state encoder 708b. The waveform state encoders 708a and 708b apply encoding specific for the waveform state to the waveform state sample vectors to produce compressed waveform data at the encoder output 711. Depending on the application, the encoder output 711 may be either maintained as separate compressed data stream outputs 711a and 711b or multiplexed into a single stream. Maintaining separate compressed data streams is advantageous when the compressed data for the different waveform states are stored in separate memory segments defined for each waveform state. It is also useful when further analysis of the compressed data for feature measurements or for generating statistics is required. Alternatively, compressed data stream outputs 711a and 711b can be multiplexed into a single stream for transfer over a high-speed interface. User control 700 allows a user to select the waveform states to be captured and compressed.

For waveforms such as those illustrated in FIGS. 4 and 5, the waveform states correspond to at least two level states, edge states and glitch states. The waveform state processor 702 selects waveform samples in a level portion for a level state of the waveform. The encoder for a given level state, for instance waveform state encoder 708a, encodes all samples in that level state. Samples that are not in a level portion are defined to be in an edge portion of the sampled waveform. The waveform state processor 702 determines an edge state for samples in each edge portion. The waveform state processor 702 also detects glitch portions of the sampled waveform.

Figure 8:
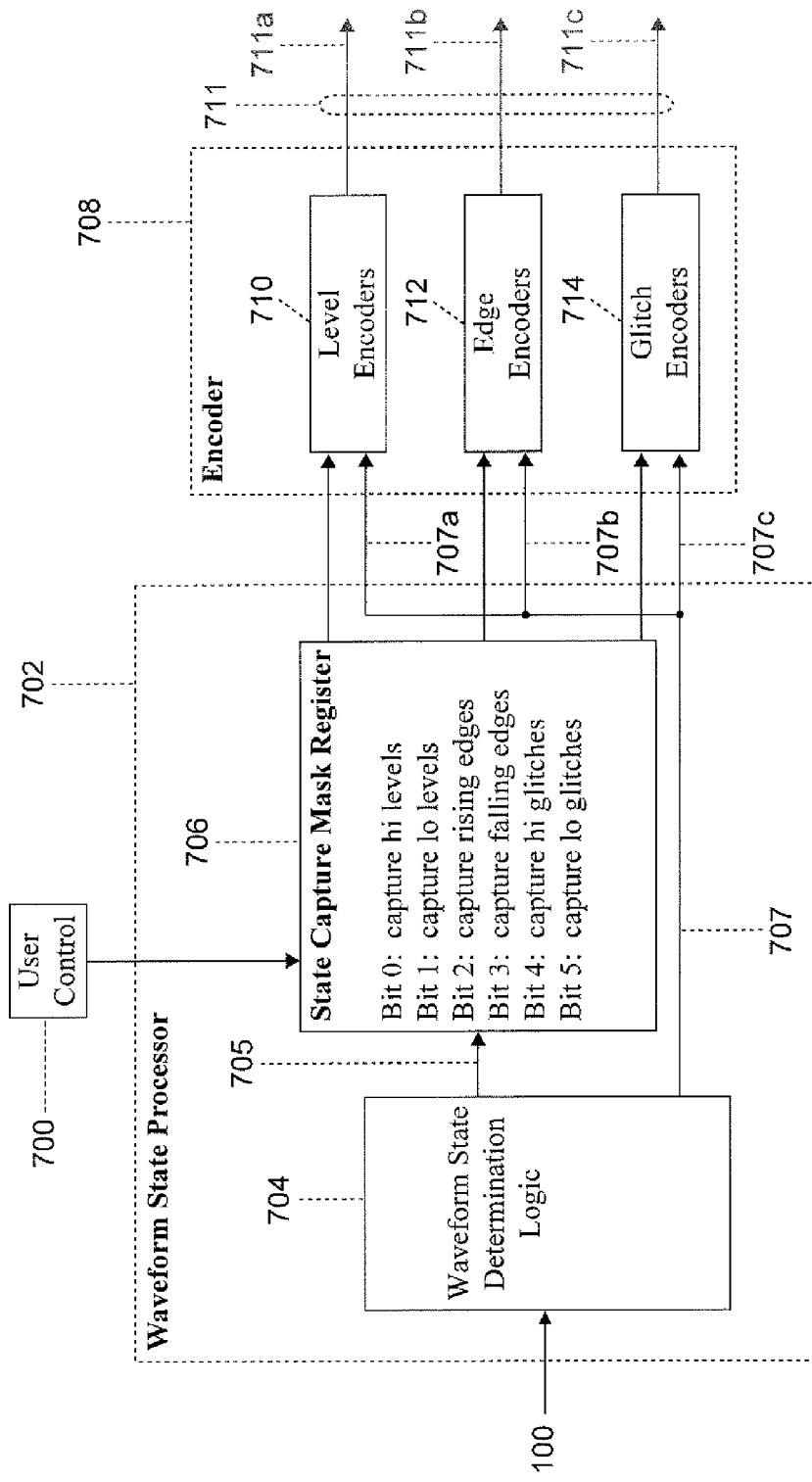
FIG. 8 is a block diagram of a compression system for a waveform having level states and edge states in accordance with a preferred embodiment.

FIG. 8 is a block diagram of a preferred embodiment of the compressor of the present invention for waveform samples having level states, edge states and glitch states. The waveform state processor 702 includes state determination logic 704 and state capture mask register 706. Waveform samples 100 are input to state determination logic 704 of the waveform state processor 702. State determination logic 704 applies algorithms described below for determining samples that are in level states, edge states and glitch states. The samples detected for the different states comprise waveform state sample vectors 707. The waveform state sample vectors 707 are transferred to their respective encoders. Level state sample vectors form input 707a to level encoder 710. Level encoder 710 includes encoders for each level state. For example, for two level states, there are two level encoders 710. Edge state sample vectors form input 707b to edge encoder 712. Edge encoder 712 includes an encoder for rising edge samples and an encoder for falling edge samples. Glitch state sample vectors form input 707c to glitch encoder 714. The state determination logic 704 also provides a state indicator 705 to the state capture mask register 706. The state capture mask register 706 allows selective encoding of the various states according to user control 700. For example, state capture mask register 706 may direct that only samples in a high level state are captured and encoded when Bit 0=1 and Bits 1 to 5 are zero. For another example, state capture mask register 706 may direct that only samples in high, or positive, glitches and low, or negative, glitches are captured when Bit 4=1 and Bit 5=1 and Bits 0 to 3 are zero. Waveform state encoders 710, 712 and 714 encode the waveform state sample vectors received via inputs 707a, 707b and 707c, respectively, to form compressed waveform data at the encoder output 711.

Figure 9:
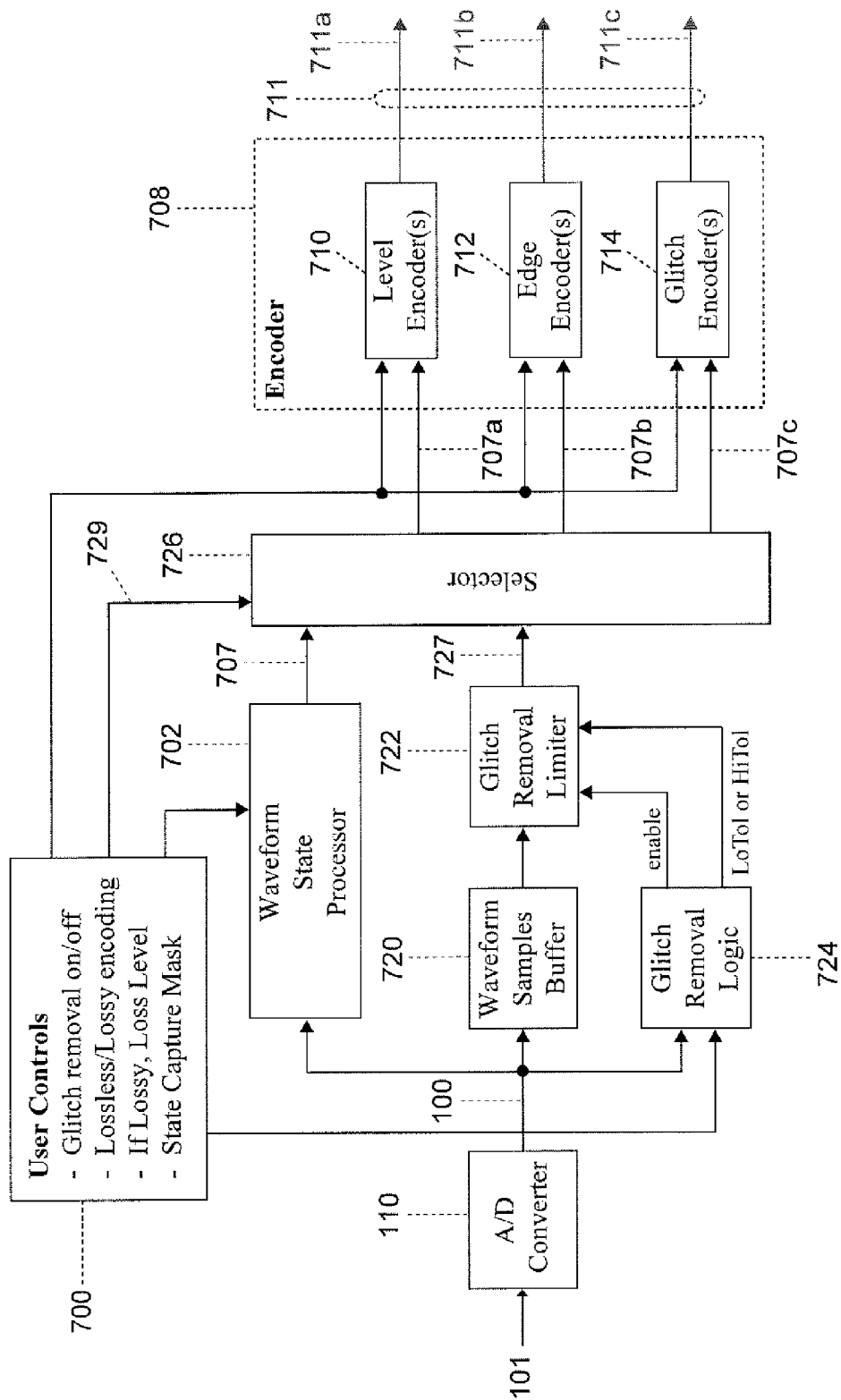
FIG. 9 is a block diagram of a compression system for a waveform having level states and edge states system for compressing samples output from an A/D converter in accordance with a preferred embodiment.

FIG. 9 is a block diagram of a preferred embodiment that includes an analog-to-digital converter 110 and glitch removal capability. This embodiment is applicable to a waveform data analyzer such as a digital storage oscilloscope of FIG. 3 or a waveform digitizer and analyzer system of FIG. 1b. Analog-to-digital converter 110 converts analog waveform 101 to waveform samples 100. Waveform state processor 702 separates waveform samples 100 into waveform state sample vectors 707, as described with respect to FIG. 8. The waveform samples 100 are also input to waveform samples buffer 720 and glitch removal logic 724. Glitch removal logic 724 detects glitch samples, as described below with reference to FIG. 21. Glitch removal limiter 722 replaces glitch samples with values that meet amplitude limit criteria to form modified waveform state sample vectors at limiter output 727. Selector 726, under control of glitch removal selector 729, selects waveform state sample vectors 707 or limiter output 727 for encoding. Selector 726 selects waveform state sample vectors of encoder input 707 when they correspond to glitch states to be encoded or glitch-free level states and edge states. Selector 726 selects modified waveform state sample vectors of limiter output 727 when they correspond to edge states or level states that have had glitches removed.

Figure 10:
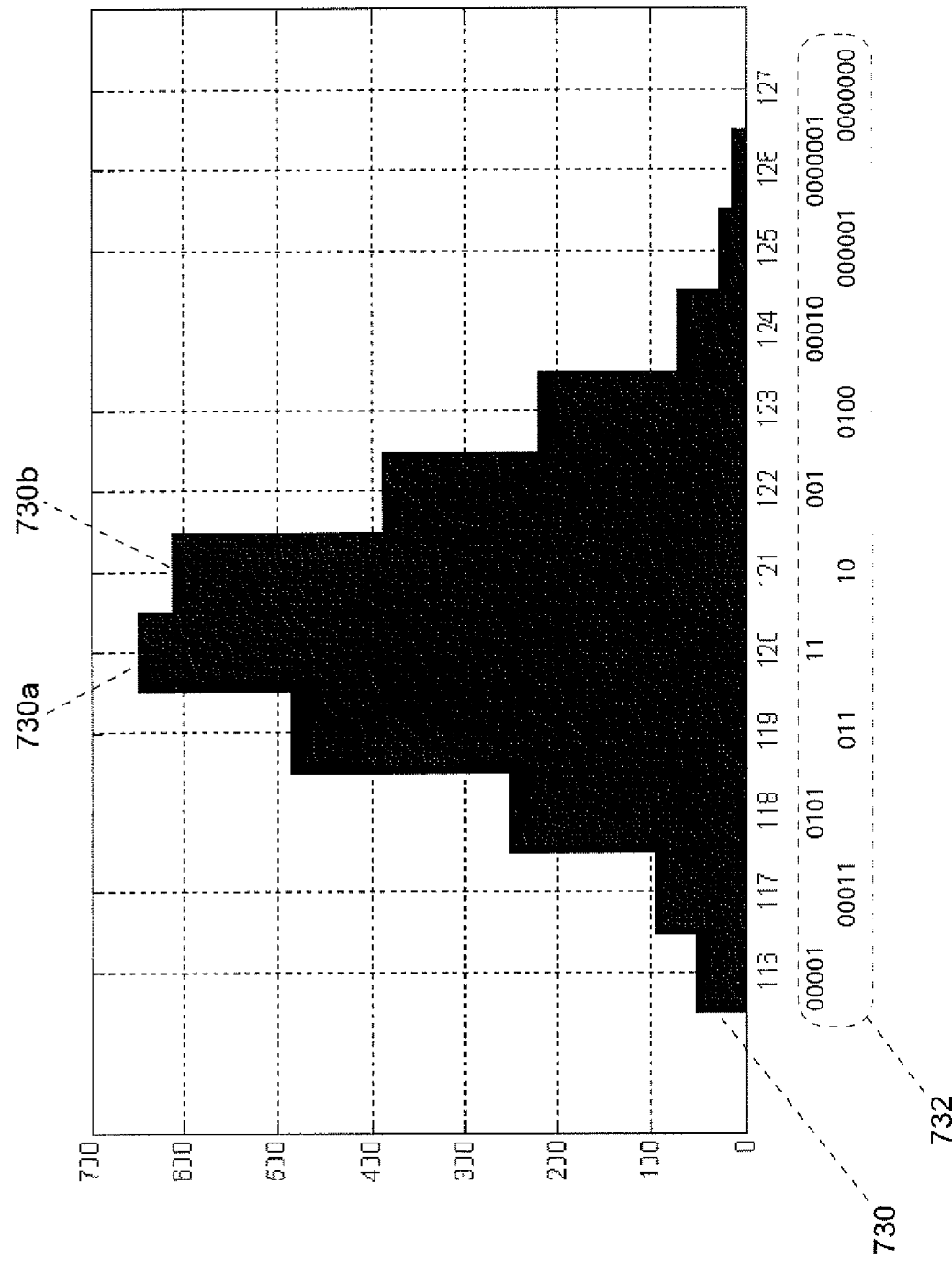
FIG. 10 gives a histogram plot of amplitudes of waveform samples and corresponding Huffman codes in accordance with a preferred embodiment.

In a preferred embodiment, the level encoder 710 includes Huffman encoding of the samples in the level state sample vector. In Huffman encoding, the number of bits in the token representing an amplitude level is inversely proportional to the frequency of samples having that amplitude level. FIG. 10 gives an example of a histogram 730 of amplitude levels and Huffman codes 732 assigned to the amplitude levels. The amplitude level bins 730a and 730b with the highest numbers of samples are assigned the Huffman codes 11 and 10, respectively, with the fewest bits. FIG. 11 is an example of a sequence of sample amplitude values 734 and their corresponding Huffman tokens 736.

In an alternative embodiment, the level encoder encodes the difference between each sample in the level state sample vector and a level state parameter. The level state parameter can be the mean amplitude for samples in that level state or the amplitude threshold for that level state. The difference samples can then be Huffman-encoded or quantized. For quantizing, the number of bits per sample is fixed, unlike Huffman encoding. Quantizing can provide lossy encoding by reducing the number of bits allocated per sample. For example, if the range of values requires three bits per sample for an exact representation, quantizing to two bits per sample provides additional compression, although error is introduced. The user can determine when the additional compression justifies the introduction of error.

Another useful level parameter is the level's run length. The level's run length can be measured in number of samples. Alternatively, when the run lengths are multiples of a minimum run length, they can be represented by the values of the multiples. For bauded signals, the minimum run length corresponds to the time interval for one baud. For a rectangular pulse sequence, the minimum run length corresponds to the time interval for one pulse. For convenience, the number of samples in the minimum run length for a level will be referred to as the number of samples per baud and a measure of run length will be referred to as the number of bauds. However, this is not intended to narrow the scope of the invention to bauded signals only. Using the number of bauds to measure run length may result in leftover samples because the ratio of the baud rate to the sample rate may not be a whole number. Both the run length in bauds and number of leftover samples can be Huffman-encoded. FIG. 12 is an example of encoded run length measurements for a sequence of levels. The "Run length" row 738 gives the run lengths, in numbers of samples, of a sequence of level portions of a waveform. The "No. of bauds" row 740 gives the run length of the level portion measured in number of bauds. The "Leftover samples" row 742 gives the number of samples greater or less than the number of bauds in the run length measurement. The "No. of bauds token" row 744 gives the Huffman token for the number of bauds. The "Leftover token" row 746 gives the Huffman code for the number of leftover samples.

Figure 13:
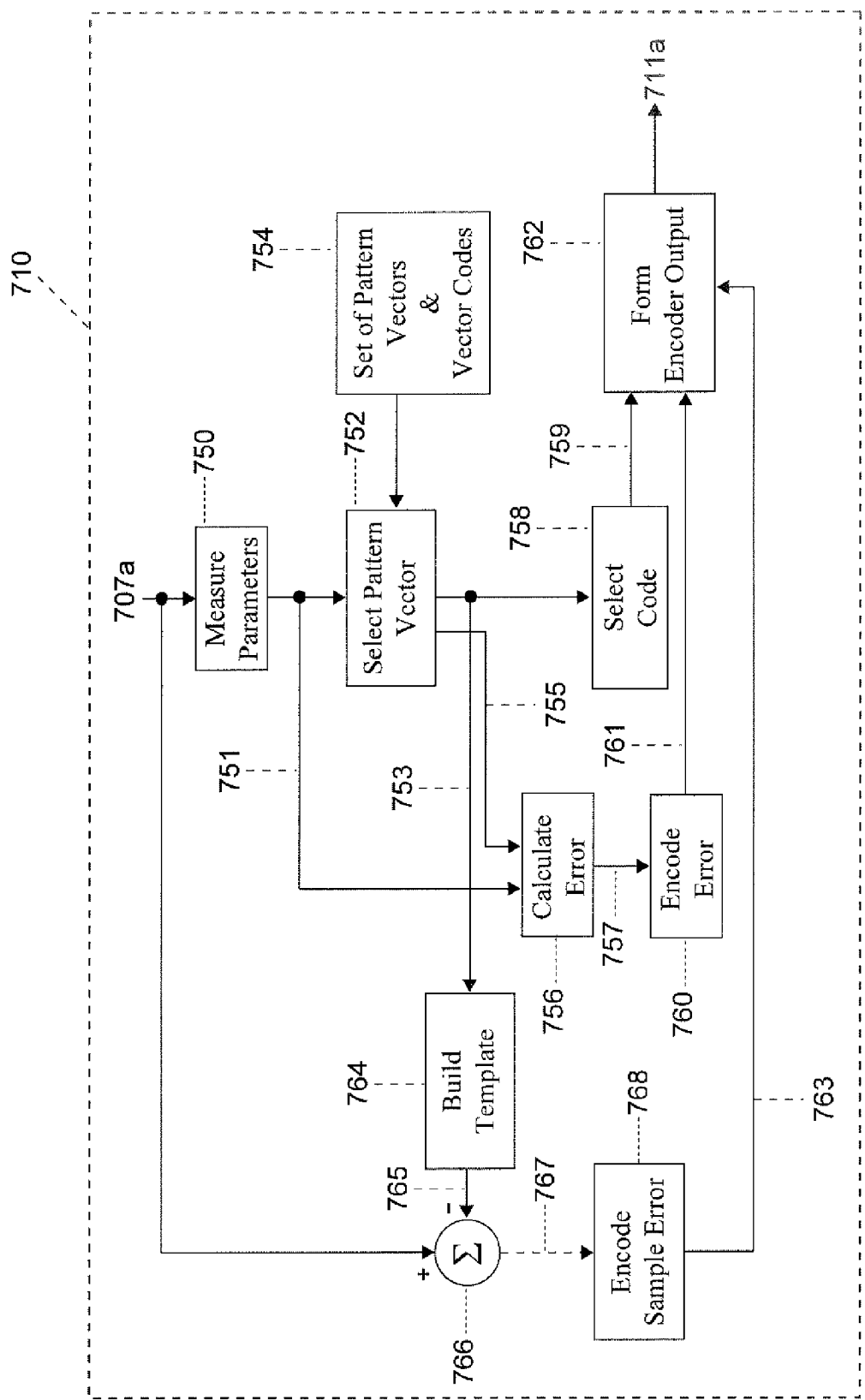
FIG. 13 is a block diagram for a level encoder in accordance with an alternative embodiment.

FIG. 13 is a block diagram of an alternative embodiment for the level encoder 710 that encodes level parameter vectors. The measure parameters block 750 measures one or more parameters of the level state sample vector input 707a to form a level parameter vector 751. For example, the amplitude threshold, mean value and run length of the level can be measured to form a level parameter vector 751. Vector encoding can be applied to the level parameter vector 751 using a set 754 of level pattern vectors and associated level vector codes formed during a training period, as described below. The selecting block 752 compares one or more parameters of the level parameter vector 751 to the corresponding parameters of the level pattern vectors of the set 754 to select a level pattern vector 753 to represent the parameter vector 751. The select code block 758 assigns the level code 759 corresponding to the selected pattern vector 753. If desired, calculate error block 756 can calculate a parameter error 757 between the level parameter vector 751 and corresponding parameters 755 of the selected pattern vector 753. Calculating the parameter error 757 is useful for observing variations in the parameters over time. The encode error block 760 then encodes the parameter error 757 or quantizes the error 757 prior to encoding it. The level vector code 759 and the encoded error 761 are input to the form level encoder output block 762 where they are used to form part of the level encoder output 711a. The set of pattern vectors 754 is generated using waveform samples 100 during a training period. Differences between the level parameter vectors 751 and the selected pattern vectors 753 may change in later regions of the waveform. For instance, baud rate variation, amplitude drift and nonlinearities can be tracked using the encoded parameter error 761.

Reconstructing the waveform samples using the selected pattern vector 753 will not always regenerate the same waveform samples in the level state sample vector 707a, resulting in lossy encoding. Lossless encoding of the samples of the level state sample vector 707a can also be achieved. The build template block 764 uses the selected pattern vector to build a corresponding level state template 765. The build template block 764 can be a look-up table of level state templates corresponding to level pattern vectors in the set 754. Subtractor 766 subtracts the level state template 765 from the level state sample vector 707a to form sample error 767. The encode sample error block 768 then encodes the sample error 767. When the encode sample error block 768 applies lossless encoding, the level state sample vector encoding will be lossless. Conversely, when the encode sample error block 768 applies lossy encoding, the level state sample vector encoding will be lossy. The encoded sample error 763 is input to the form level encoder output block 762 where it forms part of the level encoder output 711a.

For decompression, the level state sample vector is reconstructed from the selected code 759 and the encoded sample error 763. A decoder uses the code 759 to select a corresponding level state template, which would be the same as the corresponding level state template 765. The encoded sample error 763 is decoded to form a reconstructed sample error. The decoder adds the reconstructed sample error to the corresponding level state template to form a reconstructed level state sample vector. For lossless encoding, the samples in the reconstructed level state sample vector would have the same amplitudes as the samples in the level state sample vector 707a.

In another embodiment, the level encoder 710 includes feature extraction that is useful for analysis of trends in the waveform. The measure parameters block 750 can also measure features of the level state sample vector in addition to the parameters used for the encoding embodiment depicted in FIG. 13. Alternatively, measurement of one or more features of each level state sample vector can represent all the samples in the level state sample vector. Since a waveform feature normally requires less storage than the samples from which a feature was extracted, storage of waveform features is also a form of compression. The user can select which features are stored for a given waveform state. The user can balance the tradeoffs between the level of detail and the amount of storage required. High levels of compression are achieved when a single feature is stored for each waveform state sample vector. Lower levels of compression are achieved when more waveform features or information about each individual sample in the waveform state vector is captured and stored. Examples of single-feature representation include the mean, median or mode of the samples in each level state sample vector. Examples of a two-feature representation for each level state sample vector can include the mean and variance of its samples, the mean and standard deviation of its samples, or the minimum and maximum samples. The measured features can be arranged to form a level state feature vector that corresponds to the level state sample vector.

Feature extraction of the present invention can provide data reduction that differs from the data reduction currently used in digital storage oscilloscopes, previously described in the Background section. In the current digital storage oscilloscopes, data reduction is applied to all waveform samples in an interval having a fixed number of samples N. In the present invention, detection of a level state identifies samples for each level state sample vector. The level state sample vectors have various run lengths, therefore the number of samples per level interval is not fixed. Data reduction is applied to each level state sample vector, where the number of samples depends on its run length. A time stamp can be included along with the feature data in the level state feature vector to preserve the waveform state's temporal information.

Prior to level encoding, the waveform state processor 702 in FIG. 9 detects the samples belonging to each level state in order to form level state sample vectors, as described with respect to FIGS. 7, 8 and 9. The state determination logic 704 in FIG. 8 detects levels using amplitude thresholds and duration thresholds. For a waveform with two level states, such as the example waveform shown in FIG. 4, the state determination logic 704 applies at least two amplitude thresholds, a lower bound for the high amplitude level state and a higher bound for the low amplitude level state. When only a lower bound threshold is applied, the samples of the high amplitude level state will have an amplitude range from the lower bound threshold to the maximum sample amplitude and the samples of the low level state will have an amplitude range from the upper bound threshold to the minimum sample amplitude. These ranges can be further restricted by applying, in addition, an upper bound threshold to the high amplitude state and a lower bound threshold to the low amplitude state. For a waveform with multiple level states, such as the example waveform shown in FIG. 5, the state determination logic 704 applies several thresholds. At least one threshold is applied for each of the highest and lowest level states. For each intermediate level state, upper and lower bound thresholds are applied which define the amplitude range for that level state. In addition to the amplitude thresholds, the state determination logic 704 applies duration thresholds. The amplitude threshold criteria for each waveform state must be met by consecutive samples whose duration is approximately one baud interval or greater, when glitches are absent. As described previously for measuring run length, when the number of samples per baud is fractional, there can be "leftover" samples. Many algorithms for applying thresholds to waveform samples for detection are known to those skilled in the art.

Figure 14:
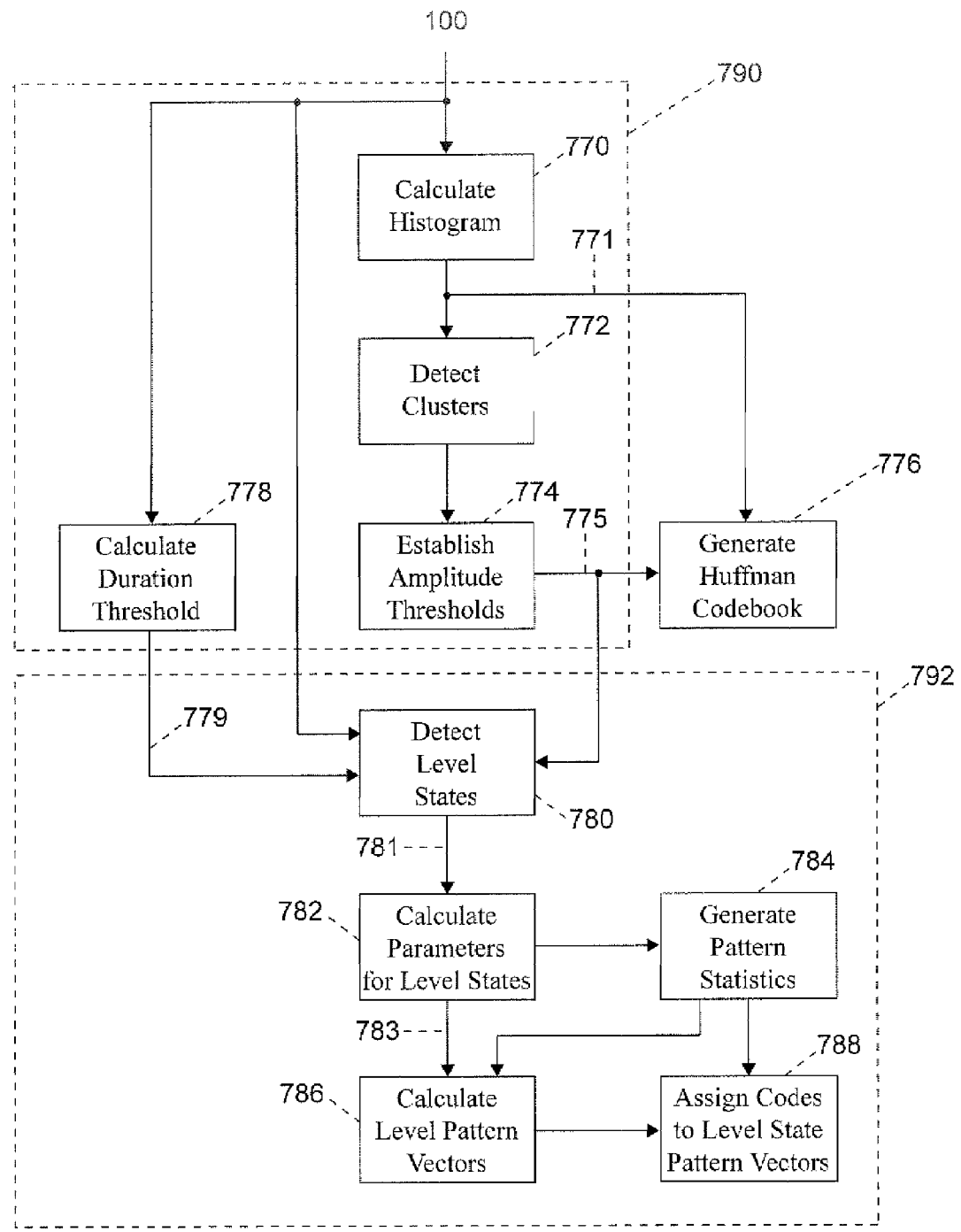
FIG. 14 is a block diagram for training the waveform state determination logic and level encoder in accordance with a preferred embodiment.

When the thresholds for level state detection are not known with sufficient accuracy, they can be established during a training period. The state determination logic 704 includes a training mode where it operates to determine the necessary parameters using the waveform samples acquired during a training period. FIG. 14 is a block diagram of a preferred embodiment for training. Training block 790 includes the steps for training state determination logic 704. During a training period, the calculate histogram block 770 determines the number of waveform samples for each amplitude level of the input waveform samples 100 to produce histogram data 771. The histograms 610 and 620 previously described with respect to FIG. 6 are examples of histogram plots. Note that the greater numbers of samples are clustered around amplitudes that correspond to the levels in the waveform. The detect clusters block 772 determines the number of clusters and the amplitude range for each of the clusters. The number of clusters indicates the number of level states in the waveform samples 100. The establish amplitude thresholds block 774 determines the amplitude thresholds for each of the level states to produce amplitude thresholds 775 for the level states. Referring to FIG. 6, for the example histogram 610 that has two level states, two thresholds are determined. For the low level state, the maximum amplitude T1 in cluster 611 is defined as the threshold so that its amplitude range is from T1 to the minimum sample amplitude. For the high level state, the minimum amplitude T2 in cluster 612 is defined as the threshold so that its amplitude range is from T2 to the maximum sample amplitude. For the histogram 620 having five level states, two thresholds are established for each of the intermediate level states. For example, lower threshold T3 and upper threshold T4 define the amplitude range for the intermediate cluster 623. Algorithms for detecting clusters in the histogram data 771 and determining thresholds are well known to those skilled in the art.

The duration threshold for a level state is approximately one baud interval or greater. If the baud interval for the waveform is not known with sufficient accuracy, it can be calculated during training. The calculate duration threshold block 778 applies a baud rate detection method to the waveform samples 100 to determine the baud interval used to establish the duration threshold. Baud rate detection methods are well known to those skilled in the art. Some are described by the present inventor in the paper, "Practical Techniques for Baud Rate Estimation," International Conference on Acoustics, Speech, and Signal Processing (ICASSP), March 1992, San Francisco, Calif., pp. IV-681 to IV-684, incorporated herein by reference.

When Huffman encoding is used by the level encoder 710, the Huffman codes for the amplitude values are determined during training. The generate Huffman codebook block 776 analyzes the histogram data 771 within the amplitude thresholds 775 to produce the Huffman codes. Referring to FIG. 10, for example, the Huffman codes 732 are produced for the cluster shown in histogram 730. Methods for generating Huffman codes are well known to those skilled in the art.

As previously described with respect to the embodiment of level encoder 710 depicted in FIG. 13, the set 754 of level pattern vectors and associated level vector codes are generated during training. Training block 792 in FIG. 14 includes the steps for generating the set 754 in FIG. 13. The detect level states block 780 applies the amplitude thresholds 775 for the level states and the duration threshold 779 to the waveform samples 100 to select samples for level state sample vectors 781. The calculate parameters block 782 calculates the desired parameters of the level state sample vectors 781 for each of the level states to form level parameter vectors 783.

The calculate level pattern vectors block 786 defines the parameter values for each level pattern vector using the corresponding parameter values in the level parameter vectors 783 for each level state. For example, the parameters can include the mean amplitude for the samples in the level state sample vector and the run length. For each level state, each pattern vector would include a mean amplitude value and a run length value. Other parameters values can be used instead of or in addition to the mean amplitude and the run length. The generate parameter statistics block 784 calculates statistics on the parameter values, including the frequencies of the parameter values, means and standard deviations that are useful for determining the level pattern vectors. The assign codes block 788 generates the vector code associated with each pattern vector. The vector code can be a variable length Huffman code. The generate parameter statistics block 784 provides the probabilities used for generating Huffman codes in the assign codes block 788. Other methods for generating pattern vectors and associated vector codes are well known to those skilled in the art.

Figure 15:
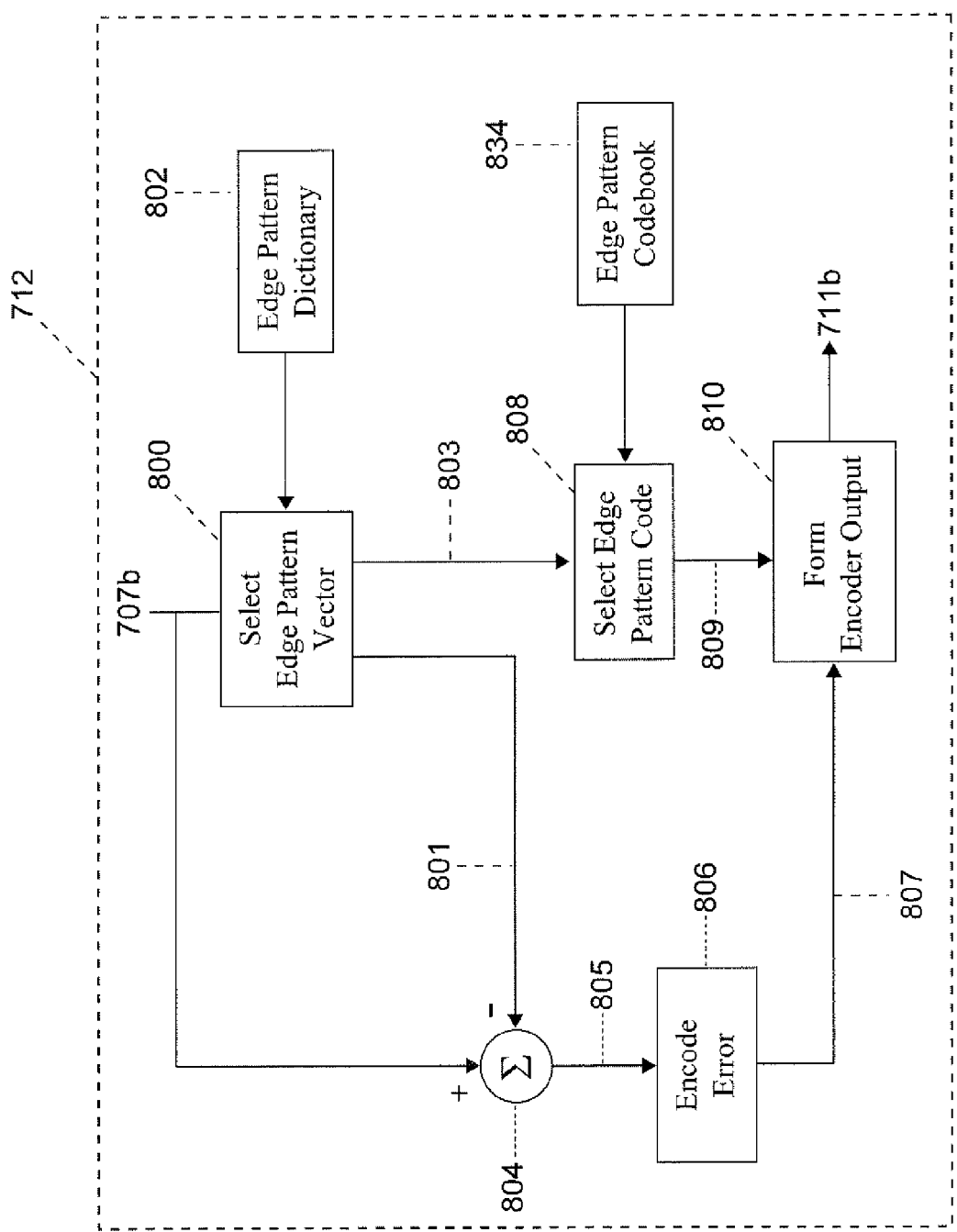
FIG. 15 is a block diagram for an edge encoder in accordance with a preferred embodiment.

Waveform samples positioned between adjacent level portions with different level amplitudes, or different level states, are defined as edge portions. Referring to FIG. 8, state determination logic 704 selects samples for edge state sample vectors 707*b* input to edge encoder 712. FIG. 15 is a block diagram of a preferred embodiment for edge encoder 712. The edge pattern vector selector 800 selects a corresponding edge pattern vector 801 and a corresponding edge pattern index 803 from a set of edge pattern vectors in an edge pattern dictionary 802 to represent an input edge state sample vector 707*b*. The edge pattern vectors included in the edge pattern dictionary 802 are determined during training as described below with respect to FIGS. 16*a* and 16*b*. Subtractor 804 subtracts the corresponding edge pattern vector 801 from the edge state sample vector 707*b* to form the edge error 805. The encode error block 806 encodes the edge error 805 to form encoded edge error 807. A preferred embodiment for encode error block is described below with respect to FIG. 19. The edge pattern code selector 808 selects the code assigned to the corresponding edge pattern index 803 in accordance with the edge pattern codebook 834. The selected edge code 809 and the encoded edge error 807 are input to the form edge encoder output block 810 for forming part of the edge encoder output 711*b*. In alternative embodiments, edge encoder 712 can provide lossless or lossy encoding to the edge state sample vector 707*b*. When the encode error block 806 applies lossless encoding to the edge error 805, the overall edge encoding process is lossless. The encode error block 806 can perform lossy encoding by quantizing the edge error 805 to fewer bits. The edge encoder 712 can also perform lossy encoding using the edge pattern code 809 alone to represent the edge state sample vector 707*b*. In this embodiment, the error 805 is not calculated so the subtractor 804 and error encoder 806 are not used.

A decompressor that receives the edge pattern code 809 and the encoded edge error 807 can reconstruct the amplitudes of the samples of the original edge state sample vector 707*b*. The decompressor decodes the edge pattern code 809 to determine the corresponding edge pattern vector. The samples of the edge state sample vector are reconstructed by adding the decoded edge error to the corresponding edge pattern vector. For lossless encoding, the amplitudes of the samples in the reconstructed edge state sample vector will equal those of the original edge state sample vector 707*b*. For lossy encoding, the amplitudes of the samples in the reconstructed edge state sample vector will approximate those of the original edge state sample vector 707*b*.

Figure 16A:
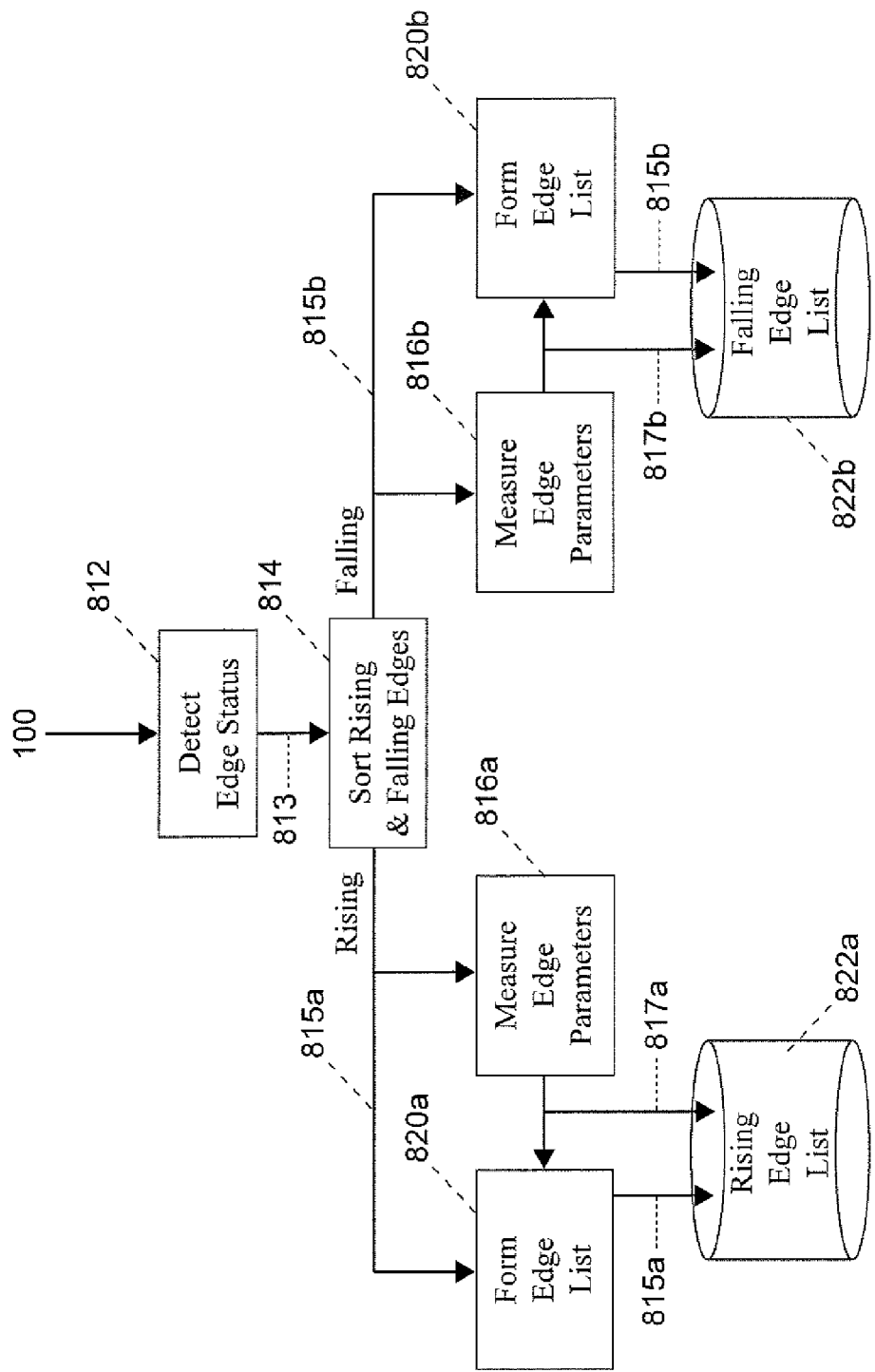
FIGS. 16a and 16b are block diagrams for training the edge encoder in accordance with a preferred embodiment.
Figure 16B:
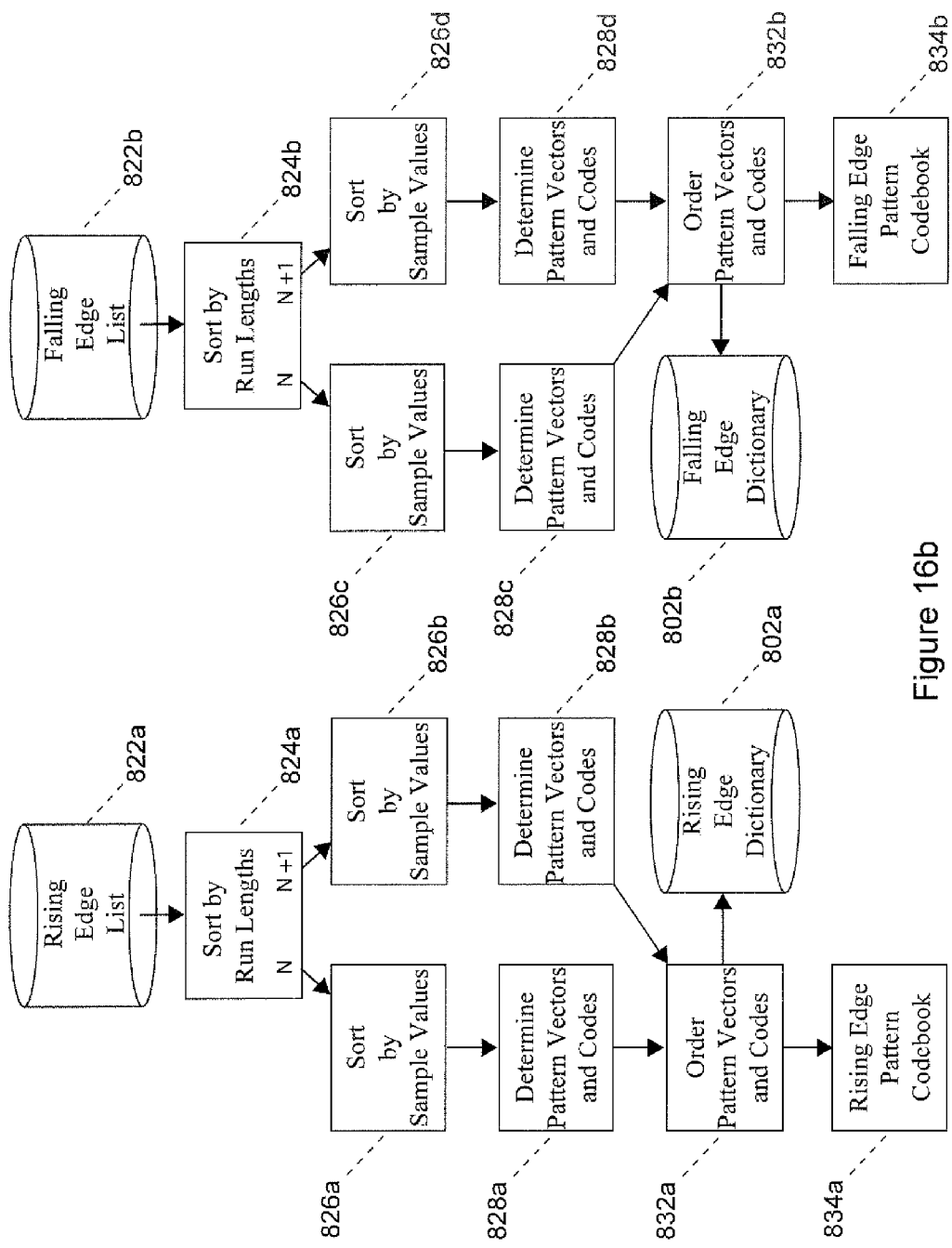

The edge encoder 712 includes a training mode in which it operates to form edge pattern vectors for the edge pattern dictionary 802 and associated edge pattern codes for the edge pattern codebook 834. FIGS. 16a and 16b are block diagrams of a preferred embodiment for training the edge encoder 712. During the training period, detect edge states block 812 selects the samples in edge portions of the waveform samples 100 to form edge state sample vectors 813. The detect edge states block 812 also detects glitches in the edge portions and selects glitch-free edges for the edge state sample vectors 813. Glitch detection is described below with respect to FIG. 21. Sorting block 814 sorts the edge state sample vectors into rising edge sample vectors 815a and falling edge sample vectors 815b. The measure edge parameters blocks 816a and 816b measure parameters 817a and 817b of the rising edge sample vectors 815a and the falling edge sample vectors 815b, respectively. The run length in number of samples is a useful parameter because edge state sample vectors with the same number of samples will be similar to each other, as described below with reference to FIGS. 17a, 17b and 17c. The form edge list blocks 820a and 820b add the rising/falling edge sample vectors 815a and 815b and their parameters 817a and 817b to a rising edge list 822a and a falling edge list 822b, respectively.

The rising edge list 822a and falling edge list 822b are used to generate a concise, yet comprehensive, set of edge pattern vectors for the edge pattern dictionary 802. Referring to FIG. 16b, sorting blocks 824a and 824b separate the rising edge sample vectors and falling edge sample vectors, respectively, into groups depending on their run lengths. For this example, the run lengths are N and N+1 samples. Sorting blocks 826a, 826b, 826c and 826d form groups of rising and falling edge sample vectors by comparing the amplitude values of the samples. Vectors whose samples have the same amplitude values for the first, second, third samples and so forth are grouped together. Processing blocks 828a, 828b, 828c and 828d then determine the edge pattern vectors for the respective run lengths. Processing blocks 828a-d remove redundant sample vectors so that one edge pattern vector represents the group. A group of sample vectors that have similar sample amplitude values can be represented by a single pattern vector whose elements are the mean, median, or weighted average of the amplitudes of corresponding elements of the sample vectors. When the sample vectors are noisy, computing a pattern vector by averaging the corresponding elements of a group of sample vectors smoothes out the noise effects. Processing blocks 828a-d can also generate edge codes associated with the pattern vectors to form the edge pattern codebook 834. Huffman codes are suitable when certain pattern vectors occur more frequently because their associated sample vectors occur frequently. For generating Huffman codes for the pattern vectors, processing blocks 828a-d calculate histograms of the numbers of rising or falling edge sample vectors, respectively, associated with each pattern vector and assign shorter codes to the pattern vectors representing those sample vectors that occur more frequently. Ordering blocks 832a and 832b place the edge pattern vectors in numerical order based on the first sample amplitude, then the second sample amplitude, etc., for the each of the run length groups. The ordered edge pattern vectors are assigned edge pattern indices which are also associated with the corresponding edge pattern codes. In an alternative embodiment, the edge pattern codes are formed by encoding the edge pattern indices themselves. This is appropriate when all the pattern vectors are selected with similar frequencies and Huffman encoding provides no advantage. The ordered sets of edge pattern vectors then form the rising edge dictionary 802a and falling edge dictionary 802b for the edge pattern dictionary 802. The edge pattern codes form the rising edge pattern codebook 834a and falling edge pattern codebook 834b for the edge pattern codebook 834. In the situation where rising and falling edges are symmetrical, having similar or identical magnitudes but opposite signs, the two edge pattern codebooks can optionally be merged together for the edge pattern codebook 834. The merged edge pattern codebook would reduce the amount of storage required.

Figure 17A:
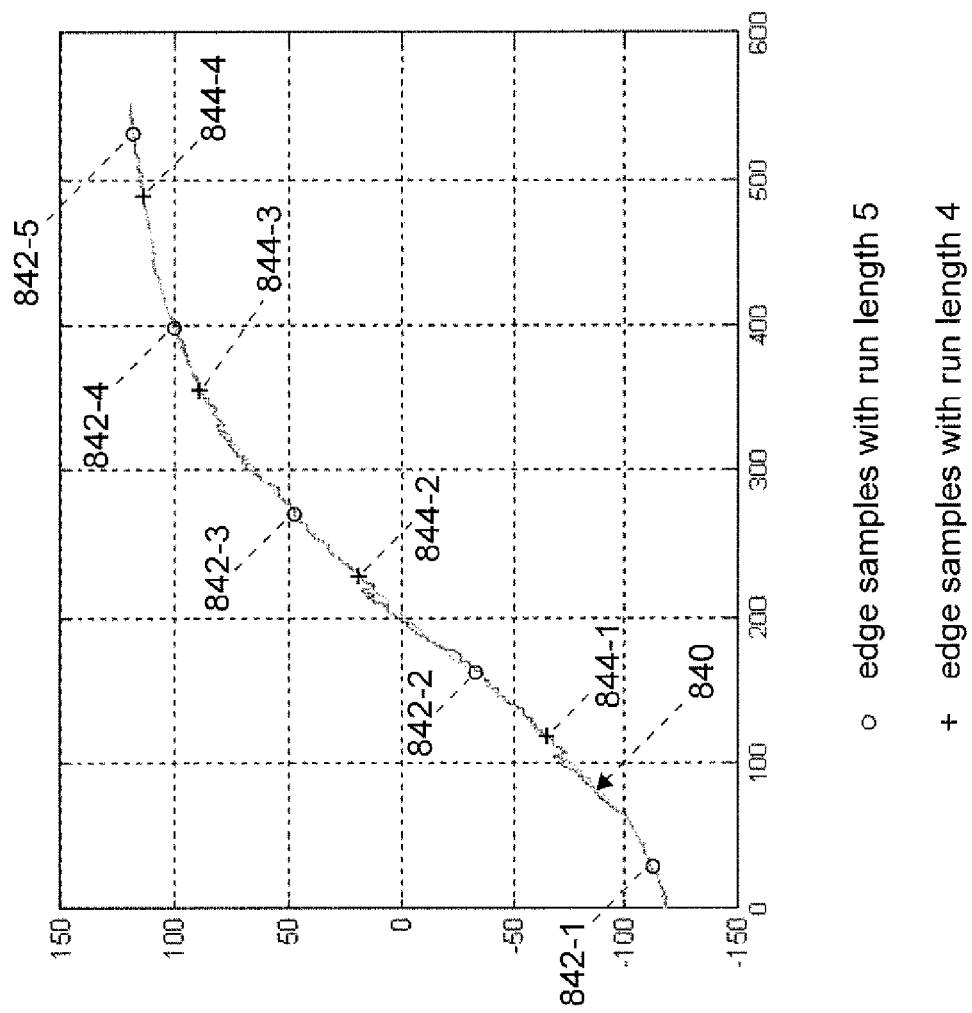
FIG. 17a is a graph of samples of all rising edges that occurred during a training period in an example in accordance with a preferred embodiment.
Figure 17B:
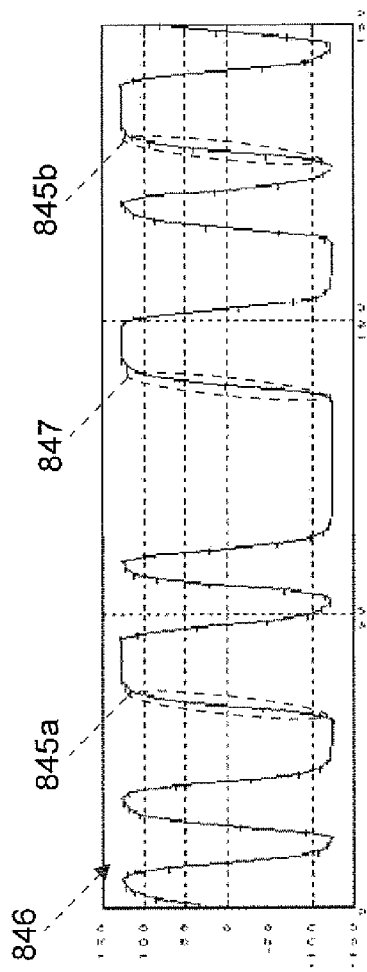
FIG. 17b is a graph of a sampled waveform in an example.
Figure 17C:
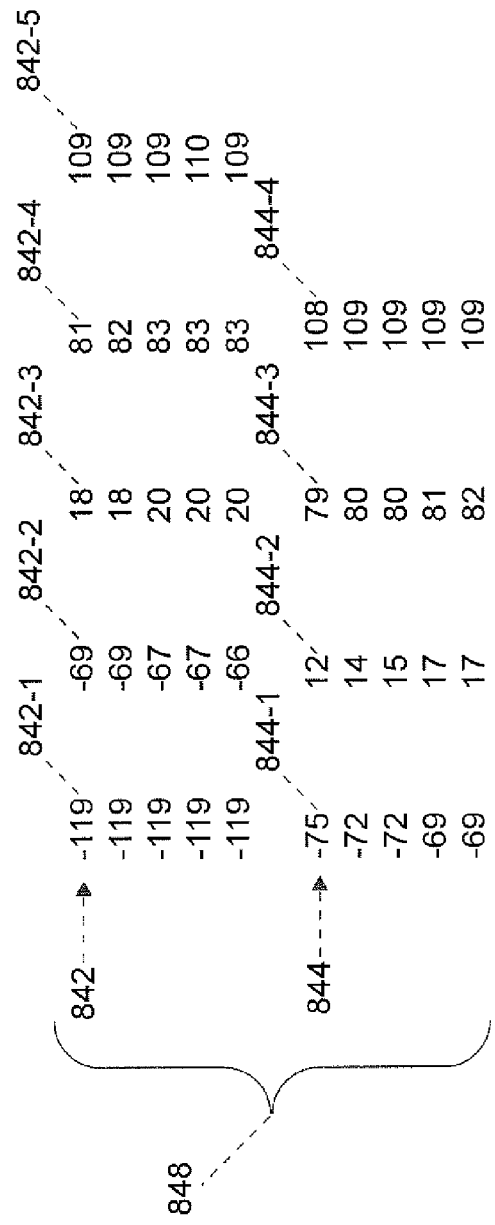
FIG. 17c is an example of an edge pattern dictionary having edge pattern vectors in accordance with a preferred embodiment.

FIGS. 17a, 17b and 17c illustrate an example of generating edge pattern vectors for edge encoder 712 during training mode in accordance with the preferred embodiment described with reference to FIGS. 16a and 16b. FIG. 17a is a graph of all the samples of rising edges 840 during a training period, although there are only four or five samples for each edge in the waveform. The edge samples marked with circles indicate sample points when there are five samples of the edge 840, 842-1, 842-2, 842-3, 842-4 and 842-5. The edge samples marked with plus signs indicate sample points when there are four samples of the edge 840, 844-1, 844-2, 844-3 and 844-4. Note that the sampling intervals are the same for the five samples 842-1 to 842-5 and the four samples 844-1 to 844-4 however the sampling phases with respect to the rising edge 840 are different. The initial sample 844-1 is at a later phase than that of the initial sample 842-1, so only four samples 844-1 to 844-4 fall on the rising edge 840. FIG. 17b presents a graph of a sampled waveform 846. Note that edges 845a and 845b sampled at similar phases have similar amplitude values for their samples. Comparison of with edge 847 sampled at a different phase shows that the sample amplitudes are different from those of edges 845a and 845b even though the shapes of the edges are very similar. FIG. 17c gives an example of a rising edge dictionary 848 for the waveform 846. The edge pattern vector 842 includes the amplitude values of the five samples 842-1 to 842-5 in FIG. 17a. The edge pattern vector 844 includes the amplitude values of the four samples 844-1 to 844-4 in FIG. 17a. The rising edge dictionary 848 shows that edges with the same number of samples have similar amplitude values. As described previously, the edge pattern vectors can be combined to form fewer entries in the rising edge dictionary 848. A single edge pattern vector whose elements are the mean, median, mode or weighted average of the corresponding elements of the edge pattern vectors to be combined can replace a given number of edge pattern vectors. The tradeoff for fewer entries is greater edge error 805, requiring more bits for encoding by the encode error block 806 in FIG. 15. When the waveform is noisy, calculating a pattern vector by averaging noisy pattern vectors can reduce noise effects. The edge error 805 would then consist primarily of noise. The encode error block 806 can quantize the edge error 805 to fewer levels, reducing the number of bits required and effectively removing noisy bits.

FIGS. 18a and 18b give an example of encoding a rising edge sample vector. FIG. 18a gives the rising edge dictionary 848, the edge pattern indices 850 and the edge pattern codes 852 for the example. The edge pattern codes are Huffman codes based on the frequencies of occurrence of the pattern vectors. FIG. 18b gives an example of encoding a new rising edge sample vector 854. Referring to FIG. 15, the rising edge sample vector 854 is the edge encoder input 707b and the rising edge dictionary 848 is included in the edge pattern dictionary 802. Edge pattern selector 800 selects edge pattern vector 856 for its output 801. The subtractor 804 calculates the edge error vector 858 as the edge error 805. The value of the corresponding edge pattern index 857 is 4, which is input 803 to the select edge pattern code block 808. The edge pattern codes 852 form part of the edge pattern codebook 834.

The select edge pattern code block selects the edge pattern code 859 which is the token "11" for its output 809.

FIG. 19 gives an example of encoding the edge error in accordance with a preferred embodiment. Table A includes tokens used to encode the error samples based on the range of error in an edge error vector. When large errors are less likely to occur than smaller errors, codes are assigned based on the error range. The exponent column A1 assigns tokens that represent the ranges of error indicated in column A2. The error column A3 gives the error values within the corresponding range. The tokens column A4 gives the tokens associated with the error values for the corresponding range. The encoded edge 860 includes the binary coded edge pattern index 860a, "100". In this example, edge pattern code is simply the binary value of the edge pattern index, 4. The encoded edge 860 also includes an encoded error portion 860b and 860c. The portion 860b is the token indicating the range of error of (0, −1). The portion 860c includes the encoded edge error samples (0, 0, 1, 0, 1). These correspond to edge error samples (0, 0, −1, 0, −1).

In an alternative embodiment, the pattern vectors are polynomial representations of the edge patterns. Referring to FIG. 17a, the graph of the samples of all rising edges 840 in this example follow similar paths that can be modeled by a polynomial function. During edge encoder training, processing blocks 828a-d in FIG. 16b generate polynomial coefficients to represent rising or falling edges using polynomial approximation methods well known in the art. The sets of polynomial coefficients for rising and falling edges are used to construct a set of rising and falling of edge models with different temporal offsets to form the edge pattern vectors for the edge pattern dictionary 802. The edge pattern codebook 834 includes codes for polynomial representations and the temporal offsets. The selecting block 800 would select the rising or falling edge model that corresponds to the temporal offset of an input edge state sample vector 707b as the corresponding edge pattern vector 801. The edge model comprises the corresponding pattern vector 801 input to subtractor 804 for calculating the edge error 805. The form encoder output block 810 includes the encoded sets of polynomial coefficients and for each edge state sample vector, encoded representations of the polynomial selection, temporal offset and edge error. For decompression, the sets of polynomial coefficients are used to construct sets of edge models at different temporal offsets. To reconstruct the edge state sample vector, the edge model at the decoded temporal offset is selected and added to the decoded edge error. Alternatively, the decoded temporal offset and polynomial coefficients can be used to construct the edge model as part of reconstructing the edge state sample vector.

As the above examples show, when the waveform has little or no noise, the selector 800 can select a corresponding edge pattern vector 801 by comparing corresponding samples of the edge state sample vector and edge pattern vector. Comparing as few as one or two samples can be sufficient, especially since any edge error is encoded. For more noisy waveforms, the edge codebook entry that is selected has the smallest absolute error, the smallest average error, or the smallest of another user-specified error metric or combination of two or more metrics. Many minimum-distance error metrics are known to those skilled in the art.

As described previously with respect to level encoder 710, feature extraction can be performed along with compression. The user can select features useful for the analysis at hand. For edge states, useful features include rise and fall times and zero crossing times. In addition, features of multiple edges used for determining positive and negative pulse widths and duty cycle can be calculated. These features can be derived from edge pattern vectors, edge state sample vectors or both. The times corresponding to zero crossing, 10% and 90% amplitudes for rise/fall times and threshold amplitudes for pulse width and duty cycle measurements can be calculated using well-known methods of interpolation. The calculated times are relative to the initial sample time of the edge pattern vector or edge state sample vector. Because the edge pattern vectors are representative of edge state sample vectors, it is efficient to analyze edge pattern vectors individually or in groups for feature extraction. For example, groups of pattern vectors can be averaged and interpolated to find an average zero crossing time. Interpolation is often used after data acquisition in digital storage oscilloscopes to improve the temporal or amplitude resolution of the waveform.

In an alternative embodiment, a polynomial representation is used for extracting edge features. For example, the 10% to 90% rise time can be calculated once based on the polynomial model and apply to all edges represented by that polynomial. For example, the zero crossing interval is determined once relative to the initial point of the polynomial model for a rising edge. The zero crossing relative to the initial sample of a particular rising edge is determined by subtracting the temporal offset of the rising edge sample vector and from the zero crossing interval.

The feature measurements can be encoded and appended to the edge state sample vectors. Alternatively, one or more feature measurements can represent all the samples in the edge state sample vector, as described previously with respect to level states. The features are arranged to form an edge state feature vector that corresponds to the edge state sample vector. A time stamp can be included with the feature data in the edge state feature vector to preserve its temporal information.

Figure 20:
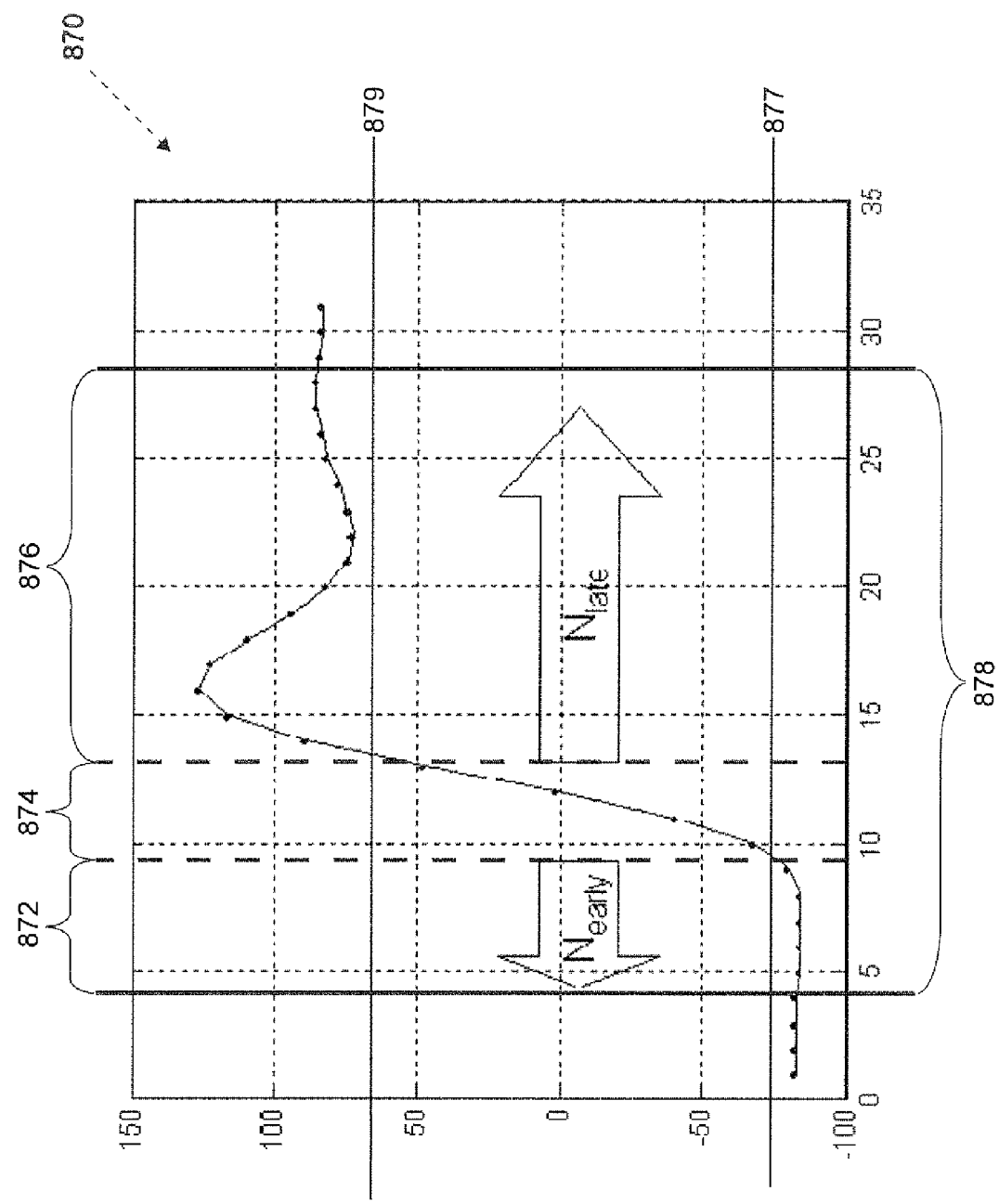
FIG. 20 gives an example of an extended edge in accordance with a preferred embodiment.

In some cases, the waveform includes transitions between levels and edges with undershoot, overshoot and ringing. These transitions are predictable from edge to edge. FIG. 20 is an example of a rising edge with ringing 870. An undershoot portion 872 and an overshoot portion 876 are adjacent to edge portion 874. Thresholds 877 and 879 are level state detection thresholds. Initially, the undershoot portion 872 and overshoot portion 876 are classified as level state samples because they meet the threshold criteria for level detection. During training, state determination logic 704 detects and reclassifies the samples corresponding to the undershoot portion 872 and the overshoot portion 876. State determination logic 704 calculates differences between consecutive level state samples near the beginning and end of the edge 874. If the difference magnitudes exceed a tolerance level, the corresponding samples are reclassified as early transition samples 872 or late transition samples 876. The numbers of samples $N_{early}$ and $N_{late}$ can also be determined during training. State determination logic 704 appends the $N_{early}$ early transition samples 872 and $N_{late}$ late transition samples 876 to the edge samples 874 to form an extended edge 878. Pattern vectors for extended edges can be determined during training described previously with respect to FIGS. 16a and 16b. During compression processing as shown in FIG. 8, state determination logic 704 appends $N_{early}$ and $N_{late}$ samples from adjacent level portions to the edge state sample vector for encoding by edge encoder 712.

Figure 21:
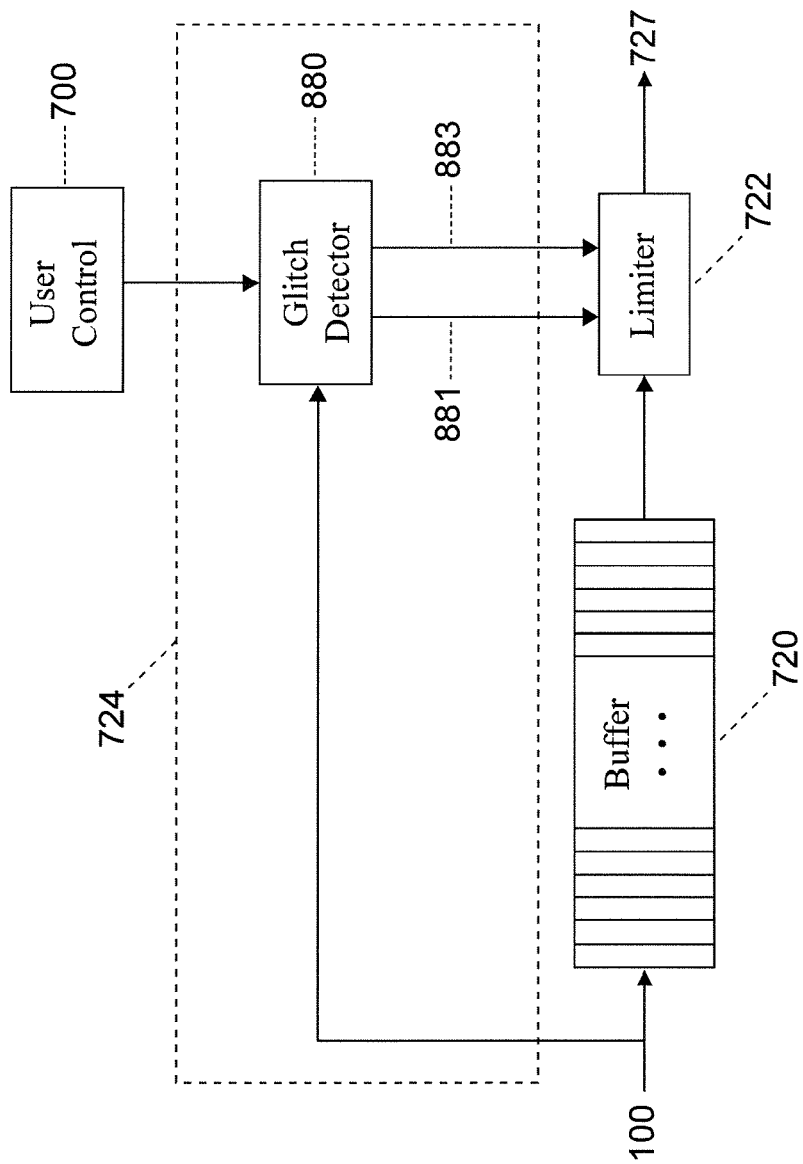
FIG. 21 is a block diagram of glitch removal logic in accordance with a preferred embodiment.

As previously described with respect to FIG. 9, a preferred embodiment includes glitch removal capability. FIG. 21 is a block diagram of glitch removal logic 724. Waveform samples 100 are provided to glitch detector 880 and waveform samples buffer 720. Glitch detector 880 applies amplitude and duration thresholds to the waveform samples 100. The user can specify an upper tolerance threshold for detecting positive glitches and a lower tolerance threshold for negative glitches. The duration threshold value is less than a baud interval. A positive glitch is detected when the amplitudes of consecutive samples rise above then fall below the upper tolerance during a time interval that is less than the duration threshold. A negative glitch is detected when the amplitudes fall below then rise above the lower tolerance during a time interval that is less than the duration threshold. When a glitch is detected, a limiter enable signal 881 enables the limiter 722 to limit the glitch samples in waveform samples buffer 720 to a limiter value 883. The limiter value 883 is normally set to the upper tolerance amplitude for a positive glitch or the lower tolerance amplitude for a negative glitch, although other values within the level's normal range could also be selected. The limiter output 727 is then provided to the selector 726 shown in FIG. 9.

Referring to FIG. 8, the state determination logic 704 also includes glitch detector 880 that provides glitch samples for a glitch state sample vector 707c input to glitch encoder 714. Glitches can be represented in a variety of ways, including:
   a) glitch duration (sample count) encoding,
   b) glitch mean value,
   c) glitch maximum and minimum values,
   d) glitch sample values,
   e) quantized glitch sample values,
   f) glitch magnitude,
   g) other glitch encoding techniques.

In a preferred embodiment for digital storage oscilloscope the features extracted from the pattern and sample vectors of level and edge states are used to determine common oscilloscope measurements. As previously described, feature vectors can be formed and appended to pattern vectors and compressed sample vectors. The feature vectors for compressed sample vectors can include time stamps that are used when measuring features across more than one edge or level. Statistics for edge and level features and other measurements using those features can be computed and analyzed. Useful oscilloscope measurements related to time include the following.
   1) Rise time and fall time—10% to 90% rise or fall time and 20% to 80% rise or fall time intervals can be calculated for individual edge pattern vectors or edge state sample vectors.
   2) Zero crossing time can be calculated for individual edge pattern vectors or edge state sample vectors relative to the initial sample of the vector.
   3) Positive or negative pulse width with respect to a threshold, such as 50% of level amplitude, requires features from two consecutive edges. The time interval corresponding to the threshold crossing (TX) on each edge is calculated relative to the initial sample of the respective edges. The pulse width (PW) calculation also requires the time interval between the two edges which can be calculated using time stamps (TS) for the initial samples of the respective edges as follows:

$PW=TS_2-TS_1-TX_1+TX_2$

Alternatively, the run length (RL) of the level state between the edges and the run length ($RE_1$) of the first edge can be used to calculate pulse width (PW) as follows:

$PW=RE_1-TX_1+RL+TX_2$

4) Period measured as the time interval between zero crossings, or other amplitude threshold crossings, of consecutive rising edges is calculated across three consecutive edges and the intervening level portions. The zero (or other threshold) crossing time intervals (TZ) and time stamps (TS) relative to the initial samples of the two rising edges are used to calculate the period (P) as follows:

$P=TS_2-TS_1-TZ_1+TZ_2$

Alternatively, the period P can be calculated using run lengths of the intervening positive and negative level portions ($RL_1$ and $RL_2$) and the first and middle edge portions ($RE_1$ and $RE_M$) between the level portions as follows:

$P=RE_1-TZ_1+RL_1+RE_M+RL_2+TZ_2$

Useful oscilloscope measurements related to amplitudes include the following.
   1) Top and maximum amplitudes can be measured for high level state sample vectors or level pattern vectors. For levels with overshoot, the maximum amplitude (max) is measured in the adjacent overshoot portion.
   2) Base and minimum amplitudes can be measured for low level state sample vectors or level pattern vectors. For levels with undershoot, the minimum amplitude (min) is measured in the adjacent undershoot portion.
   3) Amplitude (Amp) value between low and high levels is found by:

$Amp=\text{top}-\text{base}$

4) The peak to peak (PP) value between low and high levels is found by:

$PP=\text{max}-\text{min}$

Oscilloscope measurements of glitch parameters include the following:
   1) Positive glitch duration and amplitude.
   2) Negative glitch duration and amplitude.
   3) Percentage of bauds or pulses with glitches.

Jitter can also be measured using the level and edge features. The zero crossing times calculated for the edge state sample vectors can be used to measure timing jitter, with reference to a recovered clock signal (also called the "golden clock"), or with reference to the previous rising or falling edge. The level features calculated for the level state sample vectors can be used to measure amplitude jitter, which can often be correlated with the noise floor or signal-to-noise ratio (SNR) of the signal.

The present invention can be implemented in waveform analyzer systems using a variety of technologies. A preferred implementation integrates the compressor of the present invention into the data acquisition portion of a waveform analyzer system. For a digital storage oscilloscope system, such as the system shown in FIG. 1b or FIG. 3, the compressor of the present invention is adapted to operate on the output of the analog-to-digital converter 110. The compressor can be integrated into an application specific integrated circuit (ASIC) that includes an ADC. Alternatively, the compressor can be implemented in a separate, stand-alone ASIC that can be coupled to the output of an ADC chip. The stand-alone ASIC implementation can be fabricated using CMOS or other semiconductor process technology. The stand-alone ASIC implementation of the compressor also applies to a waveform data analyzer system with digital input, such as in the examples shown in FIGS. 2a and 2b.

In order to achieve high sample rates in combination with deep memory for capturing those high-speed samples, oscilloscope manufacturers such as Agilent and Tektronix have designed their own ASICs that combine ADCs with capture memory subsystems on a single IC or by a combination of ADCs and memory devices. These custom oscilloscope ASICs or combination of ADC and memory devices dedicate most of the chip area (gate count) to the memory subsystem, not to ADC subsystem. Thus from a cost perspective, the high-speed capture memory is the significantly more expensive element of the front-end oscilloscope ASIC. By enabling the storage of significantly more samples, in compressed form, in an oscilloscope's high-speed capture memory, the present invention lowers the cost per bit of one of the most expensive components of a high-speed digital storage oscilloscope (DSO). The present invention enables a significant increase in the signal duration that can be captured and stored by a DSO by compressing the samples after acquisition and prior to storing or transmitting the compressed samples in a capture memory, such as a high-speed SRAM in a DSO.

In a waveform analyzer system architecture that comprises a single integrated unit, the compressor and decompressor can be incorporated in the same device, such as an ASIC or programmable processor. For example, the same device can implement both the compression and decompression of the present invention as the compressor/decompressor 220 in FIG. 2a. For the DSO architecture in FIG. 3, the same device can implement the present invention as compressor 240 and decompressor 140. In architectures that comprise two units, a waveform data acquisition unit and a processor/display unit, the compressor is implemented in the waveform data acquisition unit and the decompressor is implemented in the processor/display unit. For example, in the logic data analyzer architecture shown in FIG. 2b, the compressor 240 is implemented in the data acquisition device 270 and decompression is implemented by signal processor device 262 in the host computer 280. For the DSO architecture of FIG. 1b, compression is implemented as part of controller 132 in digitizing device 130 and decompression is implemented in the processor 136 of the host computer 280.

Incorporating the present invention in a waveform analyzer system may increase the gate count and power consumption. However, the benefits of compression will decrease other system costs, such as the cost of storage to capture the compressed samples or the cost of a bus or network to transfer the compressed samples to other devices within the system for subsequent measurement, processing or display.

Embodiments of compression and decompression of the present invention in an ASIC can be implemented using ASIC design tools and methodologies well known to those skilled in the art. An ASIC implementation of the compression and/or decompression algorithms of the present invention can be designed using a hardware description language such as VHDL or Verilog. The register-transfer-level (RTL) representation generated in VHDL or Verilog can then be synthesized into a gate-level representation of the algorithms for the ASIC implementation. The hardware description language instructions can be stored on a CD-ROM, hard disk or other computer-readable medium for distribution and downloading to a processor that will synthesize the ASIC implementation.

Embodiments of the present invention can also be implemented in one or more programmable processors. The programmable processors include software/firmware programmable processors such as computers, digital signal processors (DSP), microprocessors (including microcontrollers) and other programmable devices, and hardware programmable devices such as complex programmable logic devices (CPLD), field programmable gate arrays (FPGA) devices. Depending on the type of programmable processor, the program implementing the operations of the present invention is represented by software, firmware, netlist, bitstream or other type of processor executable instructions and data.

A programmable hardware device such as a CPLD or FPGA can implement the compression and decompression of the present invention at slower rates than the ASIC implementations but at faster rates than the software/firmware programmable processors. The program for these devices implements the compression and/or decompression operations as a netlist or bitstream and can be stored in either an external or internal read-only memory (ROM), random access memory (RAM), flash or other storage device. Because implementations based on CPLDs or FPGAs can support higher sample rates, they are preferred over DSP chips or microprocessors. In general, CPLD devices may include some form of limited on-chip storage, so no external ROM, RAM or flash may be required to load the netlist or bitstream into a CPLD. The CPLD is ready to operate as soon as power is applied to it and samples are available. In contrast, the most popular FPGAs by Altera and Xilinx are RAM-based, so that their netlist or bitstream must be loaded into the FPGA from an external ROM, RAM or flash memory device prior to receiving samples. Well-known vendors of CPLDs and FPGAs include Altera, Xilinx, Actel and Lattice. Altera offers the RAM-based Cyclone (I and II) and Stratix (I and II) families of FPGAs and the MAX and MAX-II families of CPLDs. Xilinx offers the RAM-based Spartan (I, II and III) and Virtex (2, 4 and 5) families of FPGAs and the CoolRunner family of CPLDs. Actel offers the flash-based ProASIC (1, 2 and 3) family of FPGAs and the Axcelerator family of one-time programmable FPGAs. An FPGA or CPLD implementation of the compression and/or decompression algorithms of the present invention can be designed using a hardware description language such as VHDL or Verilog. A representation of the algorithms in VHDL or Verilog can be synthesized by a processor for the target FPGA or CPLD. The hardware description language instructions and data can be stored on a CD-ROM, hard disk or other computer-readable medium for distribution and downloading to the processor that will synthesize the FPGA or CPLD implementation.

In DSP and microprocessor implementations, the program includes instructions for executing operations for compression and/or decompression of the present invention. Microprocessors and DSPs often use external ROM or RAM that store the program represented in binary instructions (object code) and data. In other architectures, a DSP or microprocessor may be loaded with the program using a serial or parallel port. Some DSPs and microprocessors include on-chip ROM, flash or other non-volatile storage that is actually part of the DSP chip or microprocessor. For these architectures, program can be stored on-chip. The device would be able to self-boot and begin executing the instructions for compression in the program. Examples of DSPs that can be used to implement the present invention include Texas Instruments' TMS320 family of DSP chips, such as TMS320C2xx, TMS320C3xx, TMS320C5xx and TMS320C6xx. These are often used to implement DSP algorithms at moderate sample rates (generally below 10 Msamp/see per ADC, with exceptions for simple algorithms that do not require many instructions per sample). Also, any microprocessor such as the Motorola/Freescale 68000 based family, the ARM7, ARM9 and ARM11 family of microprocessors, and the 8051 family of microprocessors can be programmed to implement the present invention. For any implementation based on a DSP or microprocessor, the instructions and related data in the program for the present invention can be stored in an external or internal ROM or RAM, flash or other storage device. The program would be loaded into the DSP or microprocessor for execution. The program can also be stored on a CD-ROM, hard disk or other computer-readable media for distribution and downloading to the target programmable device.

Implementations of the present invention can perform compression in real time, that is, at least as fast as the sample rate of the waveform samples, after the training phase. Compression operations include threshold comparators for determining waveform states, accessing pattern vectors from memory and subtractors. For compression of edge state sample vectors, the first sample in the edge state sample vector is used to indicate an index for a table of the edge pattern vectors in memory. Determining the index using the first sample or another sample of the edge state sample vector is a simple operation. Embodiments using Huffman encoding for level state encoding also involve simple table look-ups. Decompression operations can also be performed in real time. Decompression operations involve using codes in the compressed waveform data to look up the associated pattern vectors, decoding any error and adding the decoded error to the pattern vector. Huffman decoding for the level states again involves simple table look-ups. To summarize, except for some delay for training, operations for compression and decompression can be performed in real time.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. In a waveform data analyzer that receives a sequence of waveform samples, wherein the sequence of waveform samples represents a waveform, and the waveform samples have one of at least two waveform states, a method of compressing the waveform samples, comprising:
   providing sets of codes associated with possible waveform states for representing waveform state sample vectors, the waveform state sample vectors including sequences of waveform samples having one of the at least two waveform states;
   determining amplitudes of waveform samples in the sequence, and classifying respective waveform samples into waveform states based on their amplitudes and the amplitudes of one or more of their neighboring waveform samples in the sequence
   defining sets of waveform samples including one or more consecutive waveform samples in the sequence as respective waveform state sample vectors based on the waveform states of the consecutive waveform samples; and
   encoding the waveform state sample vectors using the sets of codes to form compressed waveform data.

2. The method of claim 1, wherein the step of encoding further comprises:
   selecting a corresponding waveform pattern vector from a set of waveform pattern vectors to represent the waveform state sample vector, wherein each waveform pattern vector has an associated code in the set of codes associated with the waveform state; and
   selecting the associated code for the corresponding waveform pattern vector from the set of codes, wherein the associated code is used to encode the waveform state sample vector.

3. The method of claim 1, wherein the possible waveform states include at least two level states, wherein the step of defining sets of waveform samples further comprises:
   selecting one or more consecutive waveform samples of a corresponding level state to define a set of level state samples for a level state sample vector, wherein the level state samples are selected in accordance with at least one amplitude threshold and a duration threshold, such that the amplitudes of consecutive level state samples fall within a corresponding amplitude range and an interval spanned by the consecutive level state samples is greater than the duration threshold.

4. The method of claim 1, wherein the possible waveform states include at least one edge state and at least two level states, wherein the step of defining sets of waveform samples further comprises:
   selecting one or more consecutive waveform samples of a corresponding edge state between a first level state and a second level state to define a set of edge state samples for an edge state sample vector.

5. The method of claim 1, further comprising:
   selecting glitch samples from the sequence of waveform samples by applying at least one amplitude threshold and a duration threshold to the consecutive waveform samples to form a glitch state sample vector, wherein the glitch state sample vector includes consecutive glitch samples that span a duration that is less than the duration threshold, wherein the amplitudes of the consecutive glitch samples are greater than an upper tolerance threshold corresponding to the amplitude threshold for a positive glitch or less than a lower tolerance threshold corresponding to the amplitude threshold for a negative glitch.

6. The method of claim 1, wherein the compressed waveform data are formed at a rate that is at least as fast as a sample rate of the waveform samples.

7. The method of claim 1, wherein the waveform analyzer comprises a digital storage oscilloscope coupled to receive the sequence of waveform samples, the digital storage oscilloscope performing the steps of claim 1.

8. The method of claim 1, wherein the waveform analyzer comprises a logic data analyzer coupled to receive the sequence of waveform samples, the logic data analyzer performing the steps of claim 1.

9. The method of claim 1, wherein the waveform data analyzer comprises a waveform data acquisition unit coupled to receive the sequence of waveform samples, the waveform data acquisition unit performing the steps of claim 1 to form the compressed waveform data.

10. The method of claim 1, wherein one or more of the steps are embodied in a computer-implementable computer program product.

11. The method of claim 1, wherein one or more of the steps is performed by at least one of a digital signal processor (DSP) and a microprocessor.

12. The method of claim 2, wherein the step of encoding further comprises:
   determining an error between the waveform state sample vector and the corresponding waveform pattern vector; and
   encoding the error.

13. The method of claim 3, wherein the step of encoding further comprises:
   encoding the level state samples in the level state sample vector using a set of Huffman codes associated with the level state.

14. The method of claim 3, wherein the step of encoding further comprises
   determining at least one parameter of the level state sample vector to form a level parameter vector;
   selecting a corresponding level pattern vector from a set of level pattern vectors to represent the level parameter vector, wherein each level pattern vector has an associated code in the set of codes associated with the level state; and selecting the associated code for the corresponding level pattern vector, wherein the associated code is used to encode the level parameter vector.

15. The method of claim 4, wherein the step of encoding, further comprises:

selecting a corresponding edge pattern vector from a set of edge pattern vectors to represent the edge state sample vector, wherein each edge pattern vector has an associated code in the set of codes associated with the edge state; and selecting the associated code for the corresponding edge pattern vector from the set of codes, wherein the associated code is used to encode the edge state sample vector.

16. The method of claim 4, wherein the possible waveform states further include a transition state, wherein the step of defining sets of waveform samples further comprises:

selecting one or more consecutive waveform samples corresponding to a transition between the edge state and an adjacent one of the level states to define a set of transition samples for a transition sample vector.

17. The method of claim 14, further comprising:

determining an error between the level parameter vector and the corresponding level pattern vector; and encoding the error.

18. The method of claim 15, wherein the step of selecting a corresponding edge pattern vector further comprises:

comparing at least one sample value in at least one position in the edge state sample vector to a pattern sample value in the same position in at least one of the edge pattern vectors; and selecting the corresponding edge pattern vector if the sample value from the edge state sample vector is the same as or within a predetermined range of the pattern sample value in the same position of the corresponding edge pattern vector.

19. The method of claim 15, wherein the step of encoding further comprises:

determining an error between the edge state sample vector and the corresponding edge pattern vector; and encoding the error.

20. A computer-usable medium having hardware description language instructions stored thereon for execution by a processor to synthesize an implementation on one of a complex programmable logic device (CPLD), a field programmable gate array (FPGA), and an application specific integrated circuit (ASIC) to perform a method of compressing a sequence of waveform samples in a waveform data analyzer, wherein the sequence of waveform samples represents a waveform, and the waveform samples have one of at least two waveform states, the method comprising:

providing sets of providing sets of codes associated with possible waveform states for representing waveform state sample vectors, the waveform state sample vectors including sequences of waveform samples having one of the at least two waveform states;

determining amplitudes of waveform samples in the sequence, and a corresponding, classifying respective waveform samples into waveform states based on their amplitudes and the amplitudes of one or more of their neighboring waveform samples in the sequence state for each waveform sample;

defining sets of waveform samples including selecting one or more consecutive waveform samples in the sequence as respective waveform state sample vectors based on in the corresponding waveform states of the consecutive waveform samples state to form a waveform state sample vector; and encoding each the waveform state sample vectors vector using the sets of codes a corresponding waveform state encoding process to form compressed waveform data.

21. A computer-usable medium having computer-executable instructions stored thereon for execution by a processor for performing one or more steps of a method of compressing a sequence of waveform samples in a waveform data analyzer, wherein the sequence of waveform samples represents a waveform, and the waveform samples have one of at least two waveform states, the method comprising:

providing sets of codes associated with possible waveform states for representing waveform state sample vectors, the waveform state sample vectors including sequences of waveform samples having one of the at least two waveform states;

determining amplitudes of waveform samples in the sequence, and a corresponding, classifying respective waveform samples into waveform states based on their amplitudes and the amplitudes of one or more of their neighboring waveform samples in the sequence state for each waveform sample;

defining sets of waveform samples including selecting one or more consecutive waveform samples in the sequence as respective waveform state sample vectors based on in the corresponding waveform states of the consecutive waveform samples state to form a waveform state sample vector; and encoding each the waveform state sample vectors vector using the sets of codes a corresponding waveform state encoding process to form compressed waveform data.

* * * * *

UNITED STATES PATENT AND TRADEMARK OFFICE
CERTIFICATE OF CORRECTION

PATENT NO. : 7,477,999 B2
APPLICATION NO. : 11/553147
DATED : January 13, 2009
INVENTOR(S) : Albert W. Wegener It is certified that error appears in the above-identified patent and that said Letters Patent is hereby corrected as shown below:

Column 21, line 30, before the words "waveform samples" insert the words -- one-dimensional --.
Column 21, line 31, before the word "represents" insert the phrase -- of amplitude versus time --.
Column 21, line 32, delete the phrase "one of at least two" and insert the phrase -- a plurality of --.
Column 21, line 36, delete the phrase "the waveform state sample vectors including sequences of waveform samples having one of the at least two waveform states" and replace with the phrase -- wherein the possible waveform states include at least two level states and at least one edge state, wherein the sets of codes provide a plurality of codes associated with each waveform state --.
Column 21, line 40, after the word "sequence" delete ", and" and insert -- ; --.
Column 21, line 43, after the word "sequence" insert -- ; --.
Column 21, line 44, delete "sets" and insert -- groups --.
Column 21, line 45, after the word "sequence" insert the phrase -- classified into one of the waveform states --.
Column 21, lines 46-47, after the word "vectors" delete the phrase "based on the waveform states of the consecutive waveform samples".
Column 21, line 56, delete "set" and insert -- plurality --.
Column 21, lines 62-63, after the phrase "claim 1," delete the phrase "wherein the possible waveform states include at least two level states,".
Column 21, line 64, delete "sets" and insert -- groups --.
Column 21, line 66, delete "set" and insert -- group --.
Column 22, lines 7-9, after the phrase "claim 1," delete the phrase "wherein the possible waveform states include at least one edge state and at least two level states,".
Column 22, line 9, delete "sets" and insert -- groups --.
Column 22, line 13, delete "set" and insert -- group --.
Column 22, line 31, after the word "waveform" insert -- data --.
Column 22, line 35, after the word "waveform" insert -- data --.
Column 22, lines 57-60, after the word "wherein" delete the phrase "the step of encoding further comprises: encoding the level state samples in the level state sample vector using a set of" and insert the phrase -- the plurality of codes associated with the level state comprise --.
Column 22, line 60, after the word "codes" delete the phrase "associated with the level state".
Column 23, line 2, delete "set" and insert -- plurality --.
Column 23, line 12, delete "set" and insert -- plurality --.
Column 23, line 15, delete "set" and insert -- plurality --.

UNITED STATES PATENT AND TRADEMARK OFFICE
CERTIFICATE OF CORRECTION

PATENT NO. : 7,477,999 B2
APPLICATION NO. : 11/553147
DATED : January 13, 2009
INVENTOR(S) : Albert W. Wegener It is certified that error appears in the above-identified patent and that said Letters Patent is hereby corrected as shown below:

Column 23, line 20, delete "sets" and insert -- groups --.
Column 23, line 23, delete "set" and insert -- group --.
Column 23, line 52, after the word "of" insert the words -- one-dimensional --.
Column 24, line 1, after the word "samples" insert the phrase -- of amplitude versus time --.
Column 24, line 2, delete the phrase "one of at least two" and insert the phrase -- a plurality of --.
Column 24, line 4, before the word "codes" delete the duplicate phrase "providing sets of".
Column 24, lines 6-8, delete the phrase "the waveform state sample vectors including sequences of waveform samples having one of the at least two waveform states" and insert the phrase -- wherein the possible waveform states include at least two level states and at least one edge state, wherein the sets of codes provide a plurality of codes associated with each waveform state --.
Column 24, line 9, after the word "determining" insert -- the --.
Column 24, line 9, before the word "waveform" insert -- the --.
Column 24, line 10, after the word "sequence" delete "," and insert -- ; --.
Column 24, line 10, delete the phrase "and a corresponding,".
Column 24, lines 13-14, delete the phrase "state for each waveform sample".
Column 24, line 15, delete "sets" and insert -- groups --.
Column 24, line 15, delete the word "selecting".
Column 24, line 17, before the word "as" insert the phrase -- classified into one of the waveform states --.
Column 24, lines 17-20, delete the phrase "based on in the corresponding waveform states of the consecutive waveform samples state to form a waveform state sample vector".
Column 24, line 21, delete the word "each".
Column 24, line 21, delete the word "vector".
Column 24, lines 22-23, delete the phrase "a corresponding waveform state encoding process".
Column 24, line 27, after the word "of" insert -- one-dimensional --.
Column 24, line 28, after the word "samples" insert the phrase -- of amplitude versus time --.
Column 24, lines 29-30, delete the phrase "one of at least two" and insert the phrase -- a plurality of --.

UNITED STATES PATENT AND TRADEMARK OFFICE
CERTIFICATE OF CORRECTION

PATENT NO. : 7,477,999 B2
APPLICATION NO. : 11/553147
DATED : January 13, 2009
INVENTOR(S) : Albert W. Wegener It is certified that error appears in the above-identified patent and that said Letters Patent is hereby corrected as shown below:

Column 24, lines 33-35, delete the phrase "the waveform state sample vectors including sequences of waveform samples having one of the at least two waveform states" and insert the phrase -- wherein the possible waveform states include at least two level states and at least one edge state, wherein the sets of codes provide a plurality of codes associated with each waveform state --.
Column 24, line 36, after the word "determining" insert -- the --.
Column 24, line 36, before the word "waveform" insert -- the --.
Column 24, line 37, after the word "sequence" delete "," and insert -- ; --.
Column 24, line 37, delete the phrase "and a corresponding,".
Column 24, lines 40-41, delete the phrase "state for each waveform sample".
Column 24, line 42, delete "sets" and insert -- groups --.
Column 24, line 42, delete "selecting".
Column 24, lines 44-47, delete the phrase "based on in the corresponding waveform states of the consecutive waveform samples state to form a waveform state sample vector".
Column 24, line 44, before the word "as" insert the phrase -- classified into one of the waveform states --.
Column 24, line 48, delete "each".
Column 24, line 48, delete "vector".
Column 24, lines 49-50, delete the phrase "a corresponding waveform state encoding process".

Signed and Sealed this

Tenth Day of November, 2009

David J. Kappos
*Director of the United States Patent and Trademark Office*